United States Patent
Bittner et al.

(10) Patent No.: US 9,760,019 B2
(45) Date of Patent: Sep. 12, 2017

(54) PROJECTION EXPOSURE APPARATUS COMPRISING A MANIPULATOR, AND METHOD FOR CONTROLLING A PROJECTION EXPOSURE APPARATUS

(71) Applicant: Carl Zeiss SMT GmbH, Oberkochen (DE)

(72) Inventors: Boris Bittner, Roth (DE); Holger Walter, Abtsgmuend (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 71 days.

(21) Appl. No.: 15/002,564

(22) Filed: Jan. 21, 2016

(65) Prior Publication Data

US 2016/0216616 A1    Jul. 28, 2016

(30) Foreign Application Priority Data

Jan. 22, 2015   (DE) ........................ 10 2015 201 020

(51) Int. Cl.
| | | |
|---|---|---|
| G03B 27/32 | (2006.01) | |
| G03B 27/54 | (2006.01) | |
| G03B 27/68 | (2006.01) | |
| G03F 7/20 | (2006.01) | |

(52) U.S. Cl.
CPC .......... *G03F 7/70616* (2013.01); *G03F 7/705* (2013.01); *G03F 7/706* (2013.01); *G03F 7/70191* (2013.01); *G03F 7/70266* (2013.01); *G03F 7/70308* (2013.01)

(58) Field of Classification Search
CPC ............. G03F 7/70191; G03F 7/70266; G03F 7/70308; G03F 7/705; G03F 7/70591; G03F 7/706; G03F 7/70616

USPC .......... 355/52, 55, 67, 68, 71, 77; 356/124.5
See application file for complete search history.

(56) References Cited

U.S. PATENT DOCUMENTS

| | | |
|---|---|---|
| 6,398,373 B1 | 6/2002 | Guzman et al. |
| 6,803,994 B2 | 10/2004 | Margeson |
| 2002/0001088 A1 | 1/2002 | Wegmann et al. |
| 2002/0048096 A1 | 4/2002 | Melzer et al. |
| 2003/0071986 A1 | 4/2003 | Geh et al. |
| 2006/0023179 A1 | 2/2006 | Tschischgale et al. |
| 2008/0204682 A1 | 8/2008 | Uehara et al. |
| 2008/0246933 A1 | 10/2008 | Uchikawa |

(Continued)

FOREIGN PATENT DOCUMENTS

| | | |
|---|---|---|
| DE | 10 2008 042 356 A1 | 4/2010 |
| DE | 10 2011 081 603 A1 | 10/2012 |

(Continued)

OTHER PUBLICATIONS

Frank Staals et al., "Advanced Wavefront Engineering for Improved Imaging and Overlay Applications on a 1.35 NA Immersion Scanner," Proc. Of SPIE vol. 7973, 79731G-13, downloaded on Apr. 8, 2013.

*Primary Examiner* — Colin Kreutzer
(74) *Attorney, Agent, or Firm* — Fish & Richardson P.C.

(57) ABSTRACT

A method for controlling a microlithographic projection exposure apparatus includes: determining a wavefront error of the projection exposure apparatus; generating a travel vector, suitable for correcting the wavefront error, with travels for each zone of the optical manipulator; establishing a constraint parameter with respect to the travel for at least one zone of the optical manipulator; and checking the travels of the generated travel vector with respect to implementability.

23 Claims, 9 Drawing Sheets

(56) References Cited

U.S. PATENT DOCUMENTS

| | | |
|---|---|---|
| 2009/0257032 A1 | 10/2009 | Eva et al. |
| 2010/0033704 A1 | 2/2010 | Shiraishi |
| 2011/0080569 A1 | 4/2011 | Eva et al. |
| 2011/0181855 A1 | 7/2011 | Bittner et al. |
| 2011/0216303 A1 | 9/2011 | Emer |
| 2012/0188524 A1 | 7/2012 | Bittner et al. |
| 2013/0141707 A1 | 6/2013 | Baer et al. |
| 2014/0104587 A1 | 4/2014 | Friemann et al. |
| 2014/0327892 A1 | 11/2014 | Walter et al. |
| 2015/0370172 A1 | 12/2015 | Feldmann |

FOREIGN PATENT DOCUMENTS

| | | |
|---|---|---|
| DE | 10 2011 077 784 A1 | 12/2012 |
| DE | 10 2013 204 391 B3 | 5/2014 |
| JP | 2002-189193 A | 7/2002 |
| JP | 2003-215424 A | 7/2003 |
| JP | 2004-506236 A | 2/2004 |
| JP | 2010-504631 A | 2/2010 |
| JP | 2012-212884 A | 11/2012 |
| JP | 2013-106014 A | 5/2013 |
| JP | 2013-161992 A | 8/2013 |
| JP | 2015-510694 A | 4/2015 |
| WO | WO 2005/078774 A1 | 8/2005 |
| WO | WO 2008/034636 | 3/2008 |
| WO | WO 2008/034636 A2 | 3/2008 |
| WO | WO 2011/074319 | 6/2011 |

PROJECTION EXPOSURE APPARATUS COMPRISING A MANIPULATOR, AND METHOD FOR CONTROLLING A PROJECTION EXPOSURE APPARATUS

CROSS-REFERENCE TO RELATED APPLICATION

This application claims benefit under 35 U.S.C. §119 of German Patent Application Serial No. 10 2015 201 020.1, filed on Jan. 22, 2015, the entire disclosure of which is incorporated by reference herein.

FIELD

The disclosure relates to a method for controlling a microlithographic projection exposure apparatus, including a projection lens and at least one optical manipulator arranged in a beam path of the projection lens, which optical manipulator has a multiplicity of zones, distributed over a cross section of the beam path, with an individually adjustable optical effect in the beam path.

Furthermore, the disclosure relates to a microlithographic projection exposure apparatus, including a projection lens for imaging a pattern from an object plane of the projection lens into an image plane of the projection lens, and at least one optical manipulator in a beam path of the projection lens, wherein the optical manipulator has a multiplicity of zones, distributed over a cross section of the beam path, with an individually adjustable optical effect in the beam path.

BACKGROUND

Microlithographic projection exposure apparatuses are used, in particular, when producing integrated circuits or other microstructured or nanostructured components and serve to image a pattern of a mask or a reticle onto a photosensitive layer of a substrate. To this end, a conventional projection exposure apparatus contains a light source and an illumination system, which prepares electromagnetic radiation emitted by the light source and directs it onto the pattern. A portion of the pattern illuminated by the illumination system is imaged onto the photosensitive layer of a substrate using a projection lens of the projection exposure apparatus. In general, so-called wafers made out of a semiconductor material are used as substrate.

The progressive miniaturization of the structures of semiconductor components and the desire for faster production processes with shorter exposure times lead to ever higher expectations on the imaging properties of the projection exposure apparatuses and, in particular, of the projection lenses. The pattern should be imaged onto the photosensitive layer with imaging aberrations that are as small as possible during the whole period of operation of the projection exposure apparatus.

In addition to imaging aberrations due to manufacturing and assembly tolerances, imaging aberrations only occurring during operation are also known. Thus, ageing effects, e.g. a compaction of the material, and hence a locally delimited change in form may occur in optical elements at locations which are exposed to a particularly high light intensity over a relatively long time. A further cause for imaging aberrations due to operation lies in the absorption in the optical elements of the projection lens of part of the electromagnetic radiation used for the exposure. The power absorbed in the process leads to inhomogeneous heating of the optical elements, as a result of which there are changes in the refractive index, expansions and mechanical tensions. There are aberrations of the wavefront propagating in the projection lens as a result of this effect, which is referred to as "lens heating". Lens heating represents an increasing issue in semiconductor lithography due to the desired increase in power of the employed electromagnetic radiation and the advancing miniaturization.

Since the option of dynamic correction of imaging aberrations occurring or changing during operation is becoming ever more important, modern projection exposure apparatuses contain a multiplicity of optical manipulators. In these optical manipulators, the optical effect can be modified in a specific manner during the operation by way of appropriate actuators. Depending on the measured or extrapolated wavefront error, a wavefront deformation can be induced by the manipulators during the operation, which wavefront deformation is at least partly suitable for compensating the currently occurring wavefront error.

Various microlithographic optical manipulators which have a multiplicity of zones, distributed over the cross section of the beam path, with an individually adjustable optical effect are known. By way of example, US 2008/0204682 A1 describes a manipulator which applies infrared radiation onto an optical element in the form of a lens element. In the process, the lens element is irradiated variably in two dimensions. As a result of the absorption of the infrared radiation there is a corresponding heating of the irradiated lens element sections.

Furthermore, adaptive mirrors as manipulators for a microlithographic projection exposure apparatus are known. By way of example, DE 102011081603 A1 illustrates a mirror with a piezoelectric layer and a reflecting coating arranged thereabove. A different local deformation of the reflecting coating can be brought about, depending on the applied voltage, by way of a multiplicity of control electrodes distributed over the piezoelectric layer. A mirror configured in this way is also described in WO 2011/074319. Furthermore, e.g. JP 2013-161992 A or JP 2013-106014 A have disclosed adaptive mirrors, in which actuators in the form of piezoactuators or ultrasonic motors contact at various points at the rear side of the mirror. Therefore, the mirror can be conceived as distributed into zones that are actuated individually or in combination.

Furthermore, WO 2008/034636A2 describes a current-operated thermal manipulator with a plane parallel quartz plate. The plate contains a two-dimensional matrix of heating zones, which can be heated individually by way of conductor tracks and ohmic structures. By adjusting the introduced electric power, it is possible to set an individual temperature and hence a specific refractive index for each zone.

For the purposes of compensating wavefront errors which occur, or change, during the operation of a projection exposure apparatus, each zone of the described manipulators are actuated by a suitable travel command in such a way that, overall, a correction that is as ideal as possible is obtained. Here, adjustment options of other manipulators of the projection exposure apparatus are to be taken into account when determining the travels. Moreover, a number of boundary conditions are observed. By way of example, the travel for one zone can also influence adjacent zones or restrict the travels thereof. Moreover, the thermal neutrality over all zones are maintained in the case of thermal manipulators in order to avoid an impairment of adjacent structures. Determining the travels for compensating a measured wavefront error therefore leads to a very complicated optimization problem which, in general, can no longer be solved in real time during the operation of the projection exposure apparatus.

Therefore, conventionally, the travels of all zones and also of the other manipulators provided in the projection exposure apparatus are calculated in advance for specific wavefront errors, for example for specific Zernike coefficients, and provided as travel vectors in a memory for a control unit of the projection exposure apparatus. The control unit subsequently generates a travel vector with travels for all zones, suitable for compensating the wavefront error for a measured or extrapolated wavefront error, with the aid of the stored travel vectors during operation.

A disadvantage of this procedure is that the previously calculated and provided travel vectors assume a manipulator with a travel characteristic within a specific target specification. If a travel characteristic which deviates from the target specification in one or more zones arises during the operation as a result of a fault, it cannot be taken into account when generating a travel vector. Therefore, a wavefront error is no longer corrected in an ideal manner. Since a new calculation of all provided travel vectors which takes the deviating travel characteristic into account is too time-consuming, the defective components are ultimately be replaced.

An example of such a fault is an electric short circuit between two adjacent zones of a thermal manipulator, as a result of which both zones are always operated with the same electric power. Furthermore, optical elements, e.g. deformable mirrors or heatable plates, in which the travel characteristic of one or more zones already deviates too strongly from the target specifications after being manufactured, cannot be used for a manipulator.

A further example of the aforementioned fault is the failure of a channel of a manipulator which applies infrared light onto an optical element, with the consequence that the correction capability of the manipulator collapses locally. Furthermore, mechanical components which exert pressure or tension onto an adaptive mirror may be affected by a failure. It is likewise possible, for example, for the contact of an adaptive mirror with a piezoelectric layer to be damaged such that individual actuatable zones can no longer be actuated.

A further problem emerges by virtue of it being possible that a predetermined travel range of one or more travels is exceeded when generating travel commands. These travels could subsequently no longer be implemented in their entirety. Such clipping due to overdriving would lead to a worse compensation of the wavefront errors that are present or to the generation of further wavefront errors. Moreover, the control command generation overall could become unstable. Since the known control methods with provided travel vectors only allow an insufficient reaction to threatened or occurring clipping, the manipulators will not be driven up to the range boundaries from the outset. As a result of this, use is disadvantageously not made of the complete capability of the manipulators.

SUMMARY

The disclosure seeks to provide a method for controlling a projection exposure apparatus and a projection exposure apparatus, by which the aforementioned problems are solved, and in which, in particular, a sufficient compensation of a wavefront error is made possible during the operation, even in the case of a restriction in the implementability of a travel of one or more zones of an optical manipulator.

In one general aspect, the disclosure provides a method for controlling a microlithographic projection exposure apparatus, including a projection lens and at least one optical manipulator arranged in a beam path of the projection lens, which optical manipulator has a multiplicity of zones, distributed over a cross section of the beam path, with an individually adjustable optical effect in the beam path. The method includes the following steps: determining a wavefront error in an image field of the projection exposure apparatus, generating a travel vector, suitable for correcting the wavefront error, with travels for each zone of the optical manipulator via a travel-generating optimization algorithm on the basis of the determined wavefront error, establishing a constraint parameter with respect to the travel for at least one zone of the optical manipulator and checking the travels of the generated travel vector with respect to implementability taking into account the established constraint parameter. Furthermore, the following steps are carried out if a constraint in the implementability is present: obtaining a correction value vector with correction values for a plurality of the zones of the optical manipulator on the basis of the constraint parameter and the generated travel vector, establishing a corrected travel vector by correcting the travels of the generated travel vector on the basis of the corresponding correction values of the correction value vector, for example by scaled addition of the correction values of the correction value vector to the corresponding travels of the generated travel vector, and adjusting the optical effect of all zones of the optical manipulator with the aid of the corrected travel vector for compensating the wavefront error.

Furthermore, according to the disclosure, the object can be achieved by the microlithographic projection exposure apparatus described below. The projection exposure apparatus contains a projection lens for imaging a pattern from an object plane of the projection lens into an image plane of the projection lens, and at least one optical manipulator in a beam path of the projection lens, wherein the optical manipulator has a multiplicity of zones, distributed over a cross section of the beam path, with an individually adjustable optical effect in the beam path. Furthermore, the projection exposure apparatus includes a determination module for determining a wavefront error in an image field of the projection exposure apparatus, a travel generator for generating a travel vector, suitable for correcting the wavefront error, with travels for each zone of the optical manipulator via a travel-generating optimization algorithm on the basis of the determined wavefront error, a test device for establishing a constraint parameter with respect to the travel for at least one zone of the optical manipulator and for checking the travels of the generated travel vector with respect to implementability taking into account the established constraint parameter, and a correction device for correcting the generated travel vector in the case of a restriction in the implementability of at least one travel. The correction device is embodied to obtain a correction value vector with correction values for a plurality of the zones of the optical manipulator on the basis of the constraint parameter and the generated travel vector and to establish a corrected travel vector by correcting the travels of the generated travel vector on the basis of the corresponding correction values of the correction value vector, for example by scaled addition of the correction values of the correction value vector to the corresponding travels of the generated travel vector. Furthermore, the projection exposure apparatus includes an actuation device for adjusting all zones of the optical manipulator with the aid of the corrected travel vector for compensating the wavefront error. In particular, the projection exposure apparatus according to the disclosure can include a memory for storing the generated travel vector and, in particular, a further memory for storing correction value vectors.

The disclosure is based on the principle of compensating a travel for at least one zone of the optical manipulator, which was generated during the operation of the projection exposure apparatus via an optimization algorithm and which is not completely implementable, by corrected travels for other zones. The faulty optical effect of the manipulator caused by the non-implementable travel is intended to be compensated for by the optical effect of the other zones generated by the corrected travels. To this end, the generated travels are initially checked on the basis of an established constraint parameter. To this end, the constraint parameter prescribes travel restrictions for at least one zone. If a restriction in the implementability of the generated travel, and hence a travel that cannot be implemented completely, is determined for one or more zones, the generated travel vector is corrected by travels for all zones by way of a correction value vector. The correction value vector contains correction values for a plurality of zones, in particular for all zones, of the optical manipulator and it is established with the aid of the travel restriction prescribed by the constraint parameter and with the aid of the generated travel vector, in particular the non-implementable travels contained therein. By way of example, the correction is carried out by component-by-component addition of the correction value vector to the generated travel vector. The corrected travel vector established by the correction is used instead of the generated travel vector for adjusting all zones of the optical manipulator and it generates an optical effect of the manipulator which was intended to be produced by the generated travel vector.

Here, a travel is understood to mean not only a spatial displacement or rotation of an optical element, but also, in particular, a local or two-dimensional application of heat, cold, forces, moments, light with a specific wavelength or electric currents on an optical element. A change of a state variable of an optical element or manipulator by a travel, carried out via a manipulator actuation, changes the optical effect thereof in a specific manner.

Here, a travel vector or correction value vector is understood to mean a collection of a plurality of travels or correction values for, in each case, different zones of the optical manipulator. Here, a travel vector or correction value vector can additionally also contain travels or correction values for other manipulators in the projection exposure apparatus.

Using the method according to the disclosure and the projection exposure apparatus according to the disclosure, it is possible to continue to use both an optical manipulator with one or more faulty zones and generated travel vectors for compensating wavefront errors. Here, an adaptation of the optimization algorithm for the actual generation of travel vectors, which would mean a significant time outlay, is not necessary. Furthermore, overdriving of one or more zones of the optical manipulator by travels lying outside of a travel range and clipping resulting therefrom can be compensated.

In accordance with one embodiment of the method according to the disclosure, the obtaining of the correction value vector includes a selecting of a correction value vector from a multiplicity of correction value vectors provided for the projection exposure apparatus in a memory. In other words, a correction value vector established in advance is activated. This correction value vector could have been calculated within or outside of the projection exposure apparatus in advance, i.e. prior to exposure operation of the projection exposure apparatus. As a result of it being possible to obtain the correction value vector very quickly, correcting the generated travel vector in real-time during the operation is simplified.

In accordance with a further embodiment of the method according to the disclosure, obtaining the correction value vector includes the following steps: establishing of a base correction vector with base travels on the basis of the constraint parameter, establishing of a scaling factor on the basis of the generated travel vector and the established base correction vector, and calculating of the correction value vector by scaling the base correction vector with the established scaling factor. The abovementioned step of establishing a base correction vector with base travels on the basis of the constraint parameter can also be carried out in advance, i.e. prior to the exposure operation of the projection exposure apparatus, within or outside of the projection exposure apparatus.

By way of example, the base correction vector can be established for a travel of a zone which is not completely implementable and, by way of scaling with the scaling factor, it can also be used for many other travels of the zone which are not completely implementable, for the purposes of correcting the generated travel vector. A corresponding statement applies to travel restrictions predetermined by the constraint parameter in the case of a plurality of zones. The use of a base correction vector therefore substantially simplifies the establishment of correction value vectors for a multiplicity of different generated travel vectors.

In particular, in this case, the establishing of the base correction vector includes a selecting of a base correction vector from a multiplicity of base correction vectors provided for the projection exposure apparatus in a memory. By way of example, the base correction vectors can be determined in advance for various zones and different travel-restricting faults using a computer and subsequently stored in the memory. Establishing the base correction vector, and hence also correcting a generated travel vector, can thus also be carried out immediately in the case of newly occurring, travel-restricting faults of one or more zones of the optical manipulator.

In accordance with a further embodiment of the disclosure, the constraint parameter prescribes a maximum admissible travel for at least one zone of the optical manipulator. By way of example, the limit of a travel range for a zone corresponding to the target specifications can be used as maximum travel. In this manner, it is possible to correct overdriving of a zone as a result of a faulty travel generated during the operation and clipping resulting therefrom.

An embodiment of the method according to the disclosure includes a testing of an actuator characteristic of the zones of the optical manipulator with respect to observing a target specification for a travel range and fixing of the constraint parameter at a maximum admissible travel for a faulty zone with an actuator characteristic deviating from the target specification. Depending on the manipulator, e.g. a resistance characteristic of the electrically heatable zones of a plate or a different optical element for a thermal manipulator, the available or currently used radiation power of a manipulator operating with IR radiation or the deformation characteristic of the zones of an adaptive mirror are tested. A manipulator with an actuator characteristic deviating from the target specification in one or more zones can still be used for compensating wavefront errors.

In a further embodiment of the method according to the disclosure, the establishment of the base correction vector when a faulty zone of the optical manipulator with a travel range deviating from a target specification is present includes the following steps: determining a maximum correction travel for the faulty zone on the basis of the target specification and the actual travel range determining maximum travel ranges for all other zones of the manipulator, and solving an optimization problem with the maximum correction travel of the faulty zone, the maximum travel ranges of all other zones and a minimum or predetermined aberration as constraints for determining the base travels of the base correction vector.

By way of example, a difference in the limits of an intended travel range and the actual travel range can be used as maximum correction travel. In other words, the base correction vector contains as a solution of the optimization problem base travels for all zones except for the faulty zone, the combined optical effect of which corresponds to the optical effect of the maximum correction travel which cannot be implemented in reality. The base correction vector can quickly be adapted by scaling to further travels of the faulty zone which cannot be implemented in their entirety. In this manner, establishing a correction value vector, which can be carried out in real time during the operation, for a multiplicity of different travel vectors with a travel which cannot be implemented in the entirety thereof due to a faulty zone is made possible.

In accordance with a further embodiment of the method according to the disclosure, there is a testing of an actuator characteristic of the zones of the optical manipulator for establishing a presence of a faulty zone and, if a faulty zone is present, the calculating of a base correction vector during the production of the optical manipulator, and the optical manipulator is provided for the projection exposure apparatus together with the calculated base correction vector. As a result of this measure, the manipulator or the optical element of the manipulator having the zones can be provided for, and used in, the projection exposure apparatus, even if a faulty zone is present, and it need not be rejected.

In accordance with a further embodiment, the establishing of the scaling factor if a faulty zone of the optical manipulator with a travel range deviating from a target specification is present is based on an exceedance value of the travel range by the generated travel and a nominal design of the base correction vector established for the faulty zone. By way of example, by using a base exceedance value, for the correction of which the base correction vector is designed, as scaling factor, it is possible to establish the ratio of exceedance value to the base exceedance value. Together with the base correction vector for the faulty zone, the scaling factor established thus enables quick establishment of a multiplicity of different correction value vectors for exceeding the travel range in the case of a faulty zone.

In accordance with a further embodiment of the disclosure, the optical manipulator includes an irradiation device and an optical element arranged in a beam path of the projection lens. The zones on the optical element are irradiated by the irradiation device, separately in each case with radiation at a wavelength deviating from an exposure wavelength of the projection exposure apparatus, in such a way that the optical effect for compensating the wavefront error is obtained due to heating of the zones. The radiation used to heat the zones can also be referred to as heating radiation. As already mentioned previously, the heating radiation has a wavelength that deviates from the exposure wavelength of the projection exposure apparatus. The exposure wavelength is the wavelength of the exposure radiation used to image mask structures into the image plane of the projection exposure apparatus.

The wavelength of the heating radiation preferably deviates from the exposure wavelength in such a way that a majority, in particular at least 80% or 90%, of the heating radiation radiated onto the optical element is absorbed by the latter. Hence, only a small portion of the heating radiation is forwarded by the optical element in the beam path of the projection lens such that an optical element disposed downstream in the beam path does not experience any substantial heating. The optical element which is irradiated by the heating radiation can be, for example, a lens element, a radiation transmissible plate or a mirror. In particular, the optical element can be one of the optical elements of the projection lens, which define the beam path of the projection lens. That is to say, in this case, the optical element included by the optical manipulator serves, as a matter of principle, for guiding the exposure radiation in the beam path.

In the case where the optical element of the optical manipulator is a lens element, there is a change in the refractive index of the lens-element material by the irradiation with heating radiation. The zone-dependent heating of the lens-element material leads to a locally varying refractive index change in the lens element, which has a wavefront manipulation as a consequence. The functionality of a radiations transmissible plate is analogous. In the case where the optical element of the manipulator is a mirror, there is a deformation of the mirror surface due to the zone-dependent irradiation by the heating radiation due to the spatially dependent heating resulting therefrom, which likewise results in a wavefront manipulation.

In accordance with one embodiment, the respective optical effect of the zones is adjustable via respective control signals and, furthermore, there is testing for an erroneous synchronization of the control signals of two zones. The constraint parameter prescribes a uniform travel for the two affected zones if an erroneous synchronization is present.

In accordance with one embodiment variant, the optical manipulator is configured as a deformable mirror, in which the optical effect of the zones is individually adjustable via control electrodes contacting a piezoelectric layer, and the erroneous synchronization of the control signals of two zones is carried out by a short circuit of two adjacent control electrodes.

In accordance with a further embodiment variant, the optical manipulator is configured as a current-operated thermal manipulator, in which the control signals for adjusting the optical effect of the zones are generated by individual electrical heating of the zones, wherein, furthermore, the testing for an erroneous synchronization of the control signals of two zones includes testing for an electrical short circuit in the heating of two adjacent zones, the short circuit causing both zones to be heated to the same extent, and the constraint parameter prescribes a uniform travel for the two adjacent zones if a short circuit is present. Expressed differently, the optical manipulator in accordance with this embodiment variant is configured as a current-operated thermal manipulator, in which the optical effect of the zones is adjusted individually by electrical heating, wherein, furthermore, testing for an electrical short circuit in the heating of two adjacent zones is carried out, the short circuit causing both zones to be heated to the same extent, and the constraint parameter prescribes a uniform travel for the two adjacent zones if a short circuit is present. In particular, the testing for an electrical short circuit can take place after the manipulator was put into operation. As a result of this, a correction of the fault induced by the uniform travel is made possible. The manipulator can continue to be used via the corrected travels, even in the case of a short circuit between two adjacent zones.

In accordance with a further embodiment of the method according to the disclosure, the optical manipulator is configured as a current-operated thermal manipulator, in which the optical effect of the zones is adjusted individually by electrical heating, wherein, furthermore, the establishment of the base correction vector includes: a calculation of a base correction vector for two adjacent, short-circuited zones of the current-operated thermal manipulator by solving an optimization problem with a predetermined difference between different travels for the two short-circuited zones, maximum travel ranges for all other zones of the thermal manipulator and minimal aberration as constraints for determining the base travels of the base correction vector. By way of example, two travels with a base difference can be used as different travels. In other words, the base correction vector contains as a solution of the optimization problem base travels for all zones except for the two short-circuited adjacent zones, the combined optical effect of which corresponds to the optical effects of the two different travels for the short-circuited zones, which cannot be implemented in reality. By scaling, the base correction vector can quickly be adapted to other travel differences which cannot be implemented in the short-circuited zones. As a result, an establishment of a correction value vector, which can be implemented in real time during the operation, for a multiplicity of different travel vectors with different travels for the short-circuited zones becomes performable.

In accordance with a further embodiment, the respective optical effect of the zones is adjustable via respective control signals and the establishment of the base correction vector furthermore includes: a calculation of a base correction vector for two zones of the manipulator, the control signals of which are synchronized. This calculation is carried out by solving an optimization problem with a predetermined difference between different travels for the two zones with synchronized control signals, maximum travel ranges for all other zones of the optical manipulator and minimal aberration as constraints for determining the base travels of the base correction vector.

In accordance with one embodiment variant, the optical manipulator is configured as a deformable mirror, in which the optical effect of the zones is individually adjustable via control electrodes contacting a piezoelectric layer, or as a current-operated thermal manipulator, in which the optical effect of the zones is individually adjustable by electrical heating. The base correction vector is calculated for two adjacent, electrically short-circuited zones of the optical manipulator. In accordance with the second variant, the optical manipulator is therefore configured as current-operated thermal manipulator, in which the optical effect of the zones is adjusted individually by electrical heating. Here, establishing the base correction vector furthermore includes, in particular, a calculation of a base correction vector for a resistance deviation of one or more zones of the current-operated thermal manipulator by solving an optimization problem with predetermined maximum possible travels for the affected zones, maximum travel ranges for all other zones of the thermal manipulator and minimal aberration as constraints for determining the base travels of the base correction vector.

A further embodiment according to the disclosure includes a calculation and provision of base correction vectors for a multiplicity of possible short circuits between two adjacent zones of a current-operated thermal manipulator. In particular, a base correction vector is calculated for all possible short circuits between all adjacent zones of the manipulator and it is provided for the projection exposure apparatus. As a result of this measure, an appropriate base correction vector for establishing a correction value vector is immediately available when a short circuit occurs.

In accordance with a further embodiment of the disclosure, establishing the scaling factor is based on the difference of the generated travels for the two zones with synchronized control signals, in particular the two adjacent, short-circuited zones, and a nominal design of the base correction vector established for the zones with synchronized control signals, in particular the short-circuited zones. By way of example, the ratio of the difference of the travels to the base difference can be established with a base difference between two different travels, for the correction of which the base correction vector is designed, as a scaling factor. Together with the base correction vector for the short-circuited zones, the scaling factor determined thus simplifies an establishment of a multiplicity of different correction value vectors for generated travel vectors with different travels for the short-circuited zones, which cannot be carried out.

In accordance with a further embodiment of the method according to the disclosure, the optical manipulator contains a plate transparent to the exposure radiation of the projection exposure apparatus, the optical effect of the plate being temperature-dependent, wherein the zones respectively are separate, electrically heatable regions of the plate and an adjusting of the optical effect for each zone of the transparent plate is carried out by heating in accordance with the travels of the corrected travel vector. As a result of the large number of zones, such a plate allows a very flexible adjustment of the manipulator for compensating many different wavefront errors. In this embodiment, it is possible to continue to use the plate for compensation of wavefront errors, even with faulty zones.

In accordance with a further embodiment of the method according to the disclosure, the optical manipulator contains a second plate transparent to the exposure radiation of the projection exposure apparatus, the optical effect of the plate being temperature-dependent, wherein further zones of the manipulator respectively are separate, electrically heatable regions of the second plate and an adjusting of the optical effect for each zone of both plates is carried out by heating in accordance with the travels of the corrected travel vector. Using this embodiment, such a manipulator with a very large number of zones can continue to be used, even in the case of a travel-restricting defect of one or more zones.

In accordance with a further embodiment of the method according to the disclosure the optical manipulator includes a deformable mirror, wherein the zones are respectively deformable regions of a reflecting coating of the mirror, and the optical effect for each zone of the deformable mirror is adjusted by a deformation in accordance with the travels of the corrected travel vector. The deformation can be caused via piezoelectric layers, by pressure or tension from actuators in the form of rams or by the application of heating light. Manipulators with such an adaptive mirror are used, in particular, in projection exposure apparatuses with exposure radiation in the deep ultraviolet spectral range (DUV and VUV) and in the extreme ultraviolet spectral range (EUV). These manipulators can also continue to be used for correcting wavefront errors in the case of a travel-restricting fault in one or more zones.

In accordance with one further embodiment of the method according to the disclosure, the generated travel vector additionally includes travels for at least one further optical manipulator of the projection exposure apparatus, the established correction value vector contains correction values for the travels of the further manipulator, and the further manipulator is set with the aid of the corrected travel vector. Therefore, the adjustable optical effect of the at least one further optical manipulator is also taken into account when correcting travels for zones of the optical manipulator, which cannot be implemented in their entirety.

In accordance with one embodiment of the projection exposure apparatus according to the disclosure, provision is made for a memory for storing a multiplicity of correction value vectors for the correction device. Obtaining a correction value vector via the correction device can be carried out quickly by way of access to the stored correction value vectors and this enables a correction of the generated travel vector during the operation.

In accordance with a further embodiment of the projection exposure apparatus according to the disclosure, the correction device is embodied to establish a base correction vector with base travels on the basis of the constraint parameter, to establish a scaling factor on the basis of the generated travel vector, and to calculate the correction value vector by scaling the base correction vector with the established scaling factor. The base correction established for a travel which is not completely implementable by way of the prescription by the constraint parameter can, by way of scaling with the scaling factor, also be used for many other travels which are not completely implementable, for the purposes of correcting the generated travel vector. In accordance with the corresponding method claim, obtaining correction value vectors for a multiplicity of generated travel vectors is substantially simplified by the use of a base correction vector.

Furthermore, provision is made for a memory for storing a multiplicity of base correction vectors for the correction device in one embodiment of the projection exposure apparatus according to the disclosure. Base correction vectors established for various zones and different travel-restricting faults can be stored in the memory and provided for the correction device. As a result of this, establishing a base correction vector by the correction unit is accelerated and simplified.

The features specified with respect to the embodiments, exemplary embodiments and embodiment variants etc. of the method according to the disclosure, listed above, can be accordingly transferred to the projection exposure apparatus according to the disclosure. Conversely, the features specified with respect to the embodiments, exemplary embodiments and embodiment variants of the projection exposure apparatus according to the disclosure, listed above, can be accordingly transferred to the method according to the disclosure. These and other features of the embodiments according to the disclosure are explained in the description of the figures and in the claims. The individual features can be implemented, either separately or in combination, as embodiments of the disclosure. Furthermore, they can describe advantageous embodiments which are independently protectable and protection for which is claimed if appropriate only during or after pendency of the application.

BRIEF DESCRIPTION OF THE DRAWINGS

The above and further advantageous features of the disclosure are illustrated in the following detailed description of exemplary embodiments according to the disclosure with reference to the accompanying schematic drawings. In detail.

DETAILED DESCRIPTION OF EXEMPLARY EMBODIMENTS ACCORDING TO THE DISCLOSURE

In the exemplary embodiments or embodiments or embodiment variants described below, elements which are functionally or structurally similar to one another are provided with the same or similar reference signs as far as possible. Therefore, for understanding the features of the individual elements of a specific exemplary embodiment, reference should be made to the description of other exemplary embodiments or the general description of the disclosure. In order to facilitate the description, a Cartesian xyz-coordinate system is indicated in some drawings, from which system the respective positional relationship of the components illustrated in the figures is evident.

Figure 1:
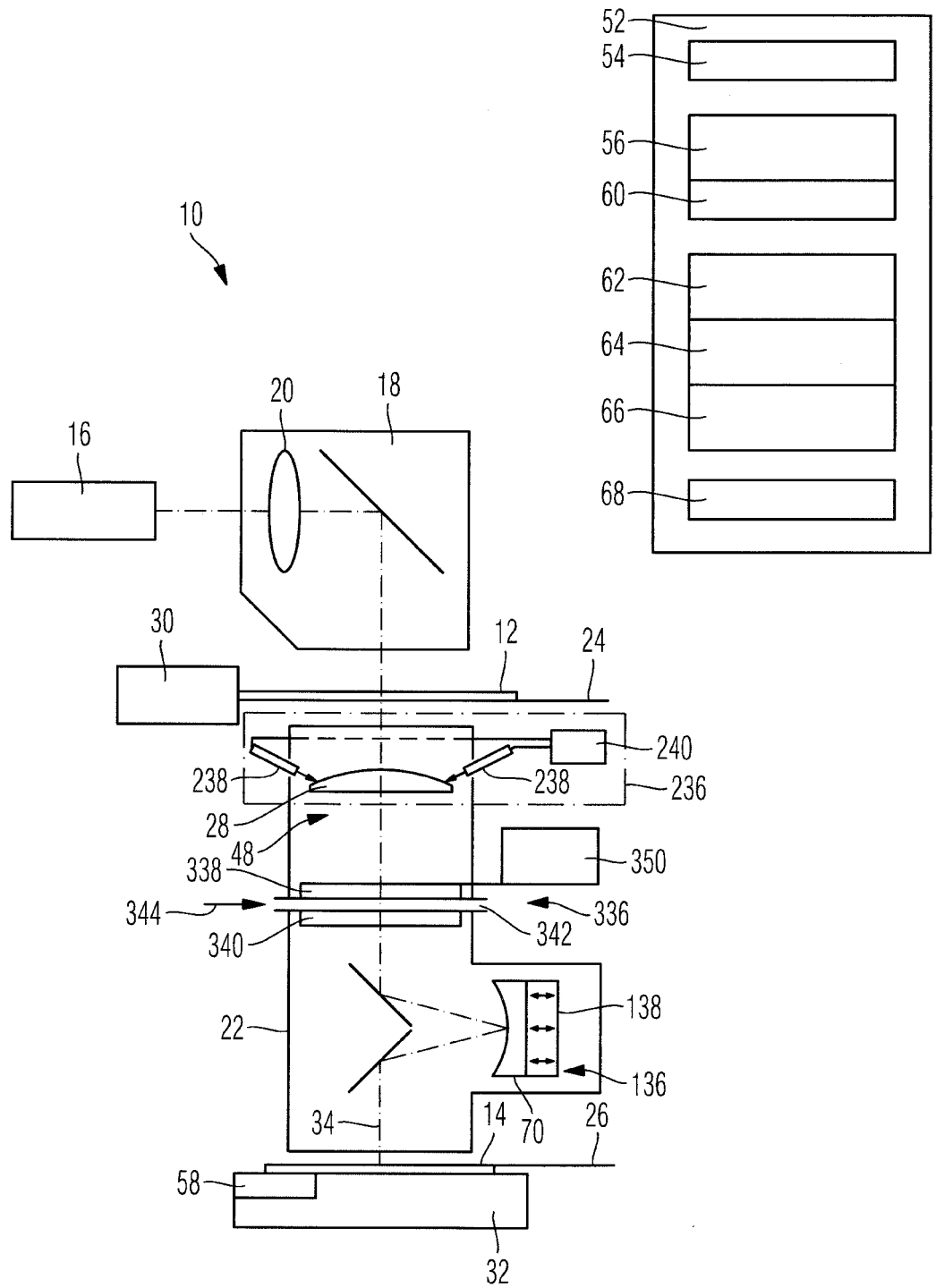
FIG. 1 shows a schematic view of an exemplary embodiment of the microlithographic projection exposure apparatus according to the disclosure.

In a schematic view, FIG. 1 illustrates a microlithographic projection exposure apparatus 10 for producing microstructured components, e.g. integrated circuits. Using the projection exposure apparatus 10, structures of a mask 12, which is also referred to as a reticle, are transferred to a photosensitive layer of a substrate 14. In general, so-called wafers made out of silicon or a different semiconductor material are used as substrate.

For this purpose, the projection exposure apparatus 10 contains a radiation source 16 for generating electromagnetic radiation. By way of example, a laser or the like, which generates electromagnetic radiation in the UV range with a wavelength of, in particular, approximately 365 nm, 248 nm or 193 nm, is used as a radiation source 16. Alternatively, the radiation source 16 can also generate radiation with a shorter wavelength, e.g. radiation in the extreme ultraviolet wavelength range (EUV) with a wavelength of less than 100 nm, in particular approximately 13.5 nm or approximately 6.8 nm.

The electromagnetic radiation 16 generated by the light source 16, which is also referred to as exposure radiation, initially passes through an illumination system 18 of the projection exposure apparatus 10. The illumination system 18 contains a multiplicity of optical elements 20, for example lens elements or mirrors, of which only one is depicted symbolically in FIG. 1 in addition to a deflection mirror. The illumination system 18 serves to illuminate the mask 12 by way of a suitable illumination beam. To this end, the illumination system 18 forms the radiation via the optical elements 20 in such a way that it has the desired properties in view of the form of the beam cross section, form of the wavefront, polarization and the like. By way of example, the illumination system contains a scanner slit for continuous scanning of the mask 12 by way of an illumination beam with a rectangular cross section and it enables a dipole, quadrupole or multi-pole illumination, wherein the individual points on the mask 12 are respectively irradiated from different directions. In this exemplary embodiment, the mask 12 is embodied as a transmission mask. Alternatively, the mask can also be configured as a reflection mask, particularly for EUV lithography.

A projection lens 22 of the projection exposure apparatus 10 images the structures of the mask 12 arranged in an object plane 24 of the projection lens 22 into an image plane 26, in which the photosensitive layer of the substrate 14 is positioned. To this end, the projection lens 22 contains a multiplicity of optical elements defining a beam path 48 of the projection lens, which optical elements are configured as lens elements, mirrors or the like in a manner dependent on the design of the projection lens 22 and the radiation wavelength. In FIG. 1, an optical element in the form of a lens element 28 and an optical element in the form of a mirror 70 are depicted in an exemplary manner.

Furthermore, the projection exposure apparatus 10 contains a positioning system 30 for holding and exactly positioning the mask and a positioning system 32 for affixing, moving and exactly positioning the substrate 14. The positioning system 30 for the mask 12 enables a spatial displacement, rotation or inclination of the mask 12 with the aid of actuators, even during operation. The positioning system 30 can also be embodied for a scanning operation for displacing the mask 12 perpendicular to an optical axis 34 of the projection lens 22.

Accordingly, the positioning system 32 for the substrate 14 is also embodied for the spatial displacement, rotation or inclination of the substrate 14 via actuators during the operation. Furthermore, the positioning system 32 enables a displacement of the substrate 14 perpendicular to the optical axis 34 for the purposes of a stepper or scanner operation.

Imaging aberrations of the projection lens 22 should be kept as small as possible when imaging the structures of the mask 12 onto the substrate 14. In addition to imaging aberrations due to manufacturing and assembly tolerances, imaging aberrations may also only occur in the projection lens 22 during operation of the projection exposure apparatus 10. Thus, ageing effects, e.g. a compaction or rarefaction of the material, and hence a locally delimited change in form may occur in lens elements 28 at locations which are exposed to a particularly high light intensity over a relatively long time.

A further cause of imaging aberrations due to operation lies in local heating of individual optical elements, such as e.g. lens elements 28, by way of an unavoidable absorption of a portion of the passing electromagnetic radiation. As a result of this, local changes in the surface geometry may occur as a result of expansion or mechanical tension. There may also be a change in the material properties, such as the refractive index.

Imaging aberrations of lenses are often described as a deviation of a measured real optical wavefront from an ideal optical wavefront. The deviation is also referred to as wavefront deformation or wavefront error and it can be decomposed into individual components by a series expansion. A decomposition according to Zernike polynomials was found to be particularly suitable in this case since the individual terms of the decomposition can be respectively assigned to specific imaging aberrations such as e.g. astigmatism or coma. A definition of the Zernike functions is presented in e.g. US 2011/0216303 A1.

For the purposes of compensating such wavefront errors that occur or change during the operation, the projection lens 22 contains at least one optical manipulator 136, 236 and/or 336 with a multiplicity of zones, distributed over a cross section of the beam path 48, with a separately adjustable optical effect. For purposes of illustration, an optical manipulator 136 with a deformable mirror 70, a thermal manipulator 236 heated by being irradiated by infrared light, and a thermal manipulator 336 heated by current are provided in the projection lens 22 in exemplary fashion. In alternative embodiments, it is possible to use both a different number of optical manipulators and differently designed manipulators with a multiplicity of zones which are individually adjustable in terms of the optical effect thereof.

The optical manipulator 136 includes the deformable mirror 70 and a manipulation device 138. The optical manipulator 136 can be arranged in a field plane or pupil plane of the projection lens 22, or therebetween, i.e. between field plane and pupil plane. The mirror 70 of the optical manipulator 136 is embodied as an adaptive mirror with a multiplicity of separately deformable regions of a reflecting coating as zones which are individually adjustable in terms of the optical effect thereof. A zone is deformed by way of the manipulation device 138. An optical manipulator 136 with such a mirror is suitable, in particular, for electromagnetic exposure radiation in the EUV spectral range.

Figure 2:
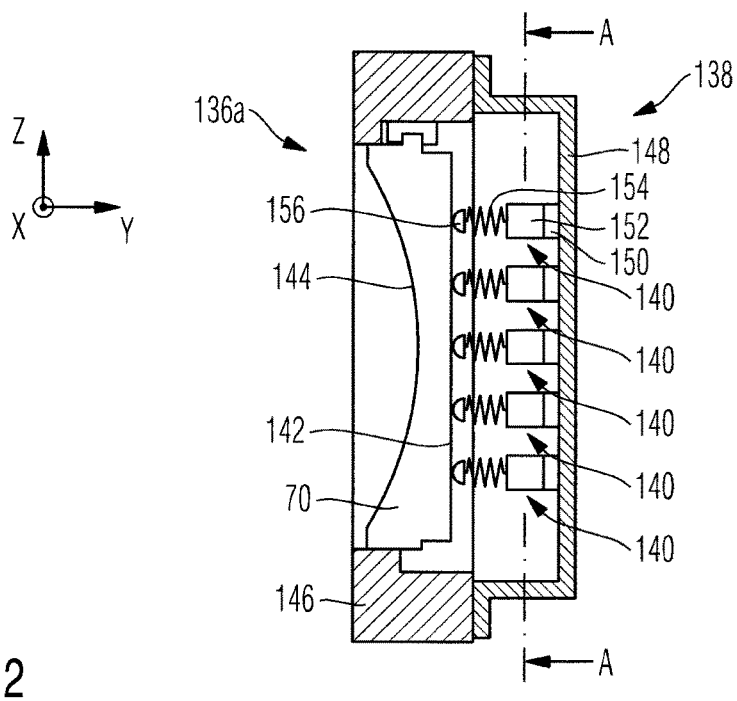
FIG. 2 shows a schematic cross section of a first exemplary embodiment of an optical manipulator of the projection exposure apparatus according to FIG. 1, including a deformable mirror.

FIG. 2 depicts a first exemplary embodiment 136*a* of the optical manipulator 136 including a deformable concave mirror 70 and actuators 140, which act perpendicularly (in the −Y-direction) against the rear side 142 of the mirror 70. By way of example, such an optical manipulator 136 is described in JP 2013-161992 A. The mirror 70 has a reflecting coating 144 on the front side thereof and it is secured by a mirror holder 145. The manipulator 136 furthermore contains a manipulation device 138 with a housing 148 and a multiplicity of actuators 140 fastened thereto. Each actuator 140 includes a pressure sensor 150, a drive element 152, a spring 154 and a contact element 156. The drive element 152 is embodied in a manner expandable and contractable in the Y-direction and it can, for example, include a piezoelectric element or an ultrasonic motor for this purpose. Depending on the extent of the drive element 152, a corresponding force acts in the contact region on the rear side 142 of the mirror 70 by way of the spring 154 and the contact element 156. As a result of this there is a local deformation of the reflecting coating 144. The acting force is detected by the pressure sensor 150 and it can be processed by a controller (not depicted here) for setting a predetermined deformation.

Figure 3:
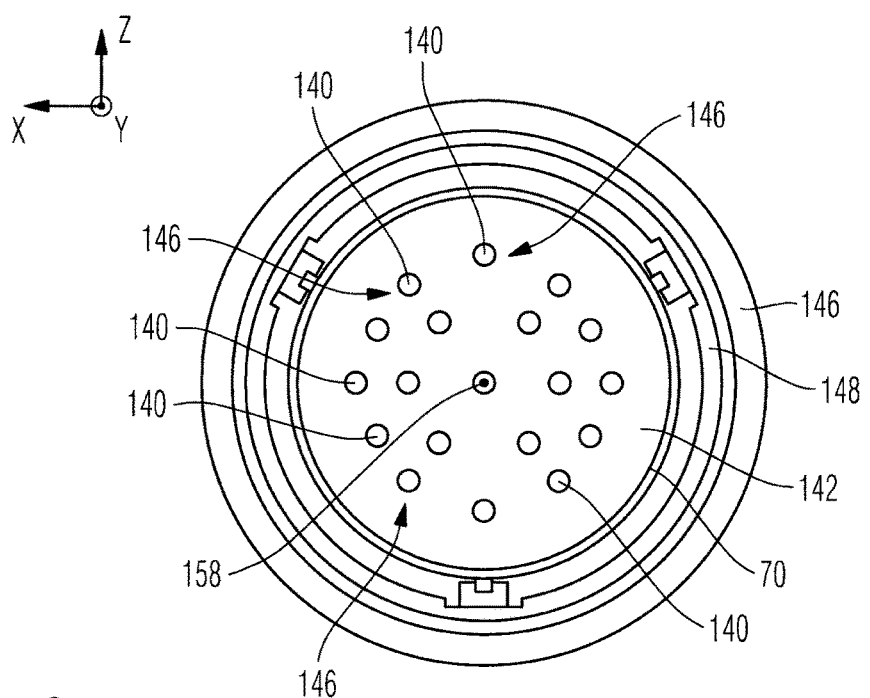
FIG. 3 shows the optical manipulator including a deformable mirror in accordance with FIG. 2 in a schematic cross section along the line A-A in FIG. 2.

FIG. 3 shows a cross section of the optical manipulator 136*a* along the line A-A in FIG. 2. The actuators 140 are arranged symmetrically in relation to the optical axis 158 of the mirror 70 at the rear side 142 thereof. Each actuator 140 can be actuated individually and it causes a local deformation of the mirror 70 at the pressure region thereof. These pressure regions therefore constitute zones 146 of the optical manipulator 136*a* which are individually adjustable in terms of the optical effect thereof.

Figure 4:
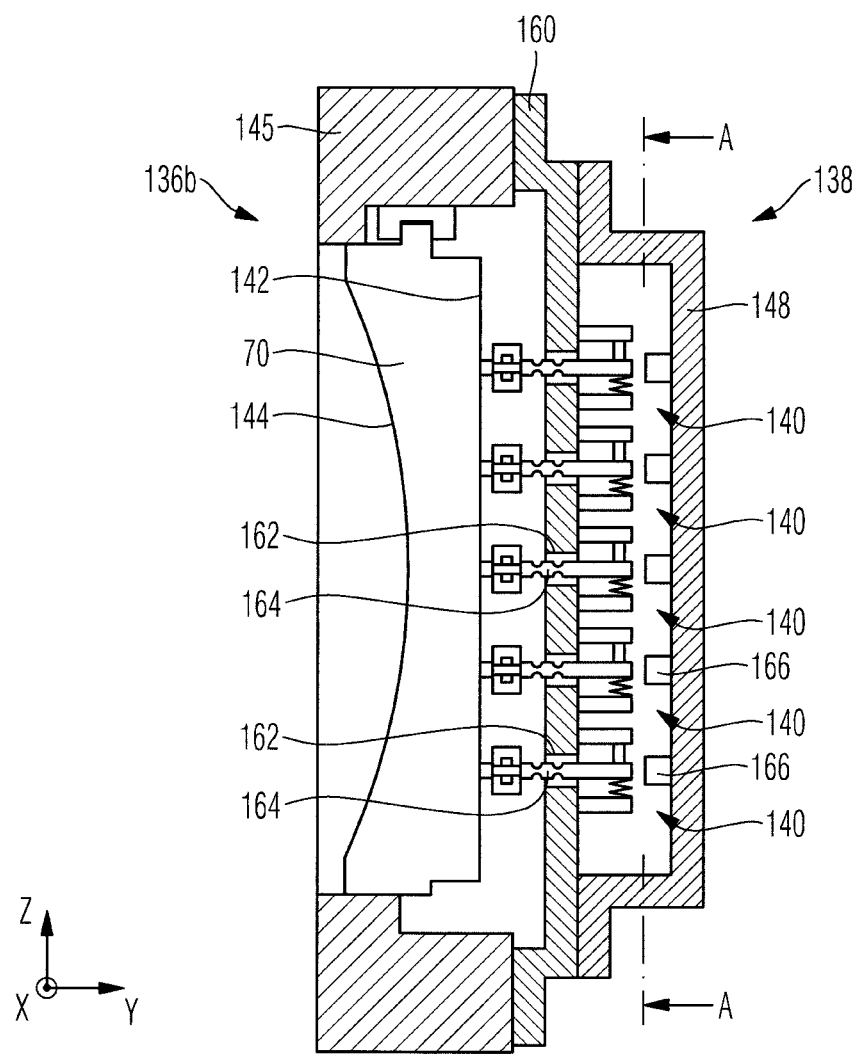
FIG. 4 shows a schematic cross section of a second exemplary embodiment of an optical manipulator of the projection exposure apparatus according to FIG. 1, including a deformable mirror.

FIG. 4 depicts a second exemplary embodiment 136*b* of the optical manipulator 136 with a deformable concave mirror 70, as is disclosed, for example, in JP 2013-106014. The mirror 70 is secured by a mirror holder 145 and has a reflecting coating 144 on the front side thereof. Furthermore, the optical manipulator 136*b* contains a manipulation device 138 with a multiplicity of actuators 140. The actuators 140 are fastened to a support plate 160 and act on mirror posts 164, which are fastened to the rear side 142 of the mirror 70 and which extend in the Y-direction through recesses 162 in the support plate 160. In contrast to the exemplary embodiment according to FIG. 2, the actuators 140 exert a force in the X-direction and Z-direction, i.e. parallel to the rear side 142 of the mirror 70, and therefore laterally on the mirror posts 164, thereby bringing about a local deformation of the reflecting coating 144 of the mirror 70. Furthermore, the optical manipulator 136*b* contains a housing 148, at which position sensors 166 for determining the X-Z-deflection of the mirror posts 164 are arranged.

Figure 5:
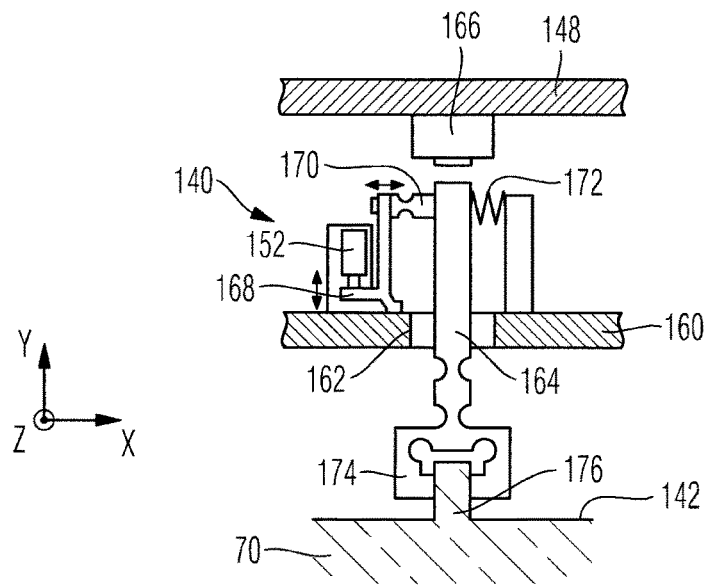
FIG. 5 shows a schematic view of an actuator of the optical manipulator according to FIG. 4.

FIG. 5 shows a detailed schematic view of an actuator 140 of the optical manipulator 136 according to FIG. 4. The actuator 140 contains a drive element 152. The drive element 152 is fastened to the support plate 160 and it can extend or contract in the Y-direction. An end of the drive element 152 moving in the process acts on an arm of an L-shaped lever 168, which is fastened to the support plate 160 in a pivotable manner. As a result, a different arm of the lever 168 in this actuator 140 moves in the X-direction and acts on the mirror post 164 by way of a connection element 170. The mirror post 164 is pre-tensioned by a spring 172 and it extends through the recess in the direction of the mirror 70. By way of a fastening element 174, the mirror post 164 is fastened to a part 176 of the mirror 70 projecting from the rear side 142. For the purposes of deflecting the mirror post 164 in the Z-direction, the actuator 140 contains a further drive element, a correspondingly arranged lever with a connection element and a further spring.

Figure 6:
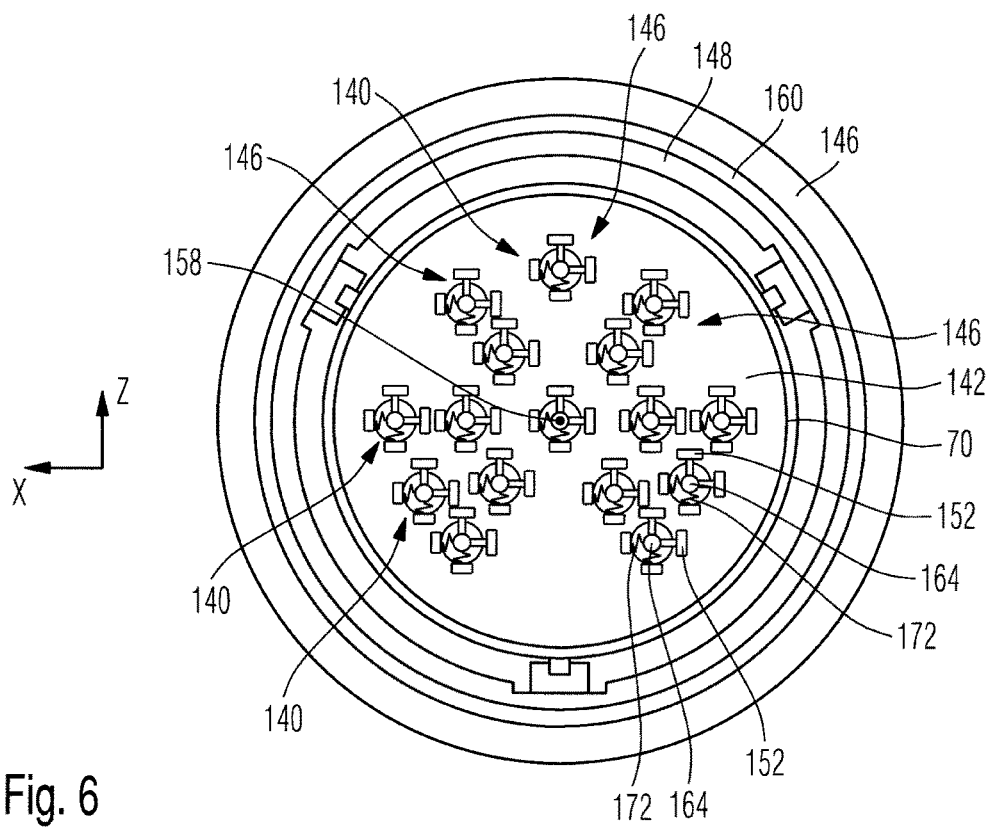
FIG. 6 shows the optical manipulator including a deformable mirror in accordance with FIG. 4 in a schematic cross section along the line A-A in FIG. 4.

FIG. 6 shows a cross section of the optical manipulator 136*b* in accordance with FIG. 4 along the line A-A in FIG. 4. What can clearly be identified is that each actuator 140 respectively has a spring 172 and a drive element 152 for deflecting the mirror post 164 in the X-direction and in the Z-direction. The actuators are in part arranged symmetrically in relation to the optical axis 158 of the mirror 70 at the rear side 142 thereof. Each actuator 140 can be actuated individually and it causes a local deformation of the reflective coating 144 of the mirror 70. These local regions in the actuators 140 represent zones 146 of the optical manipulator 136*b* which can be separately adjustable in terms of the optical effect thereof.

Figure 7:
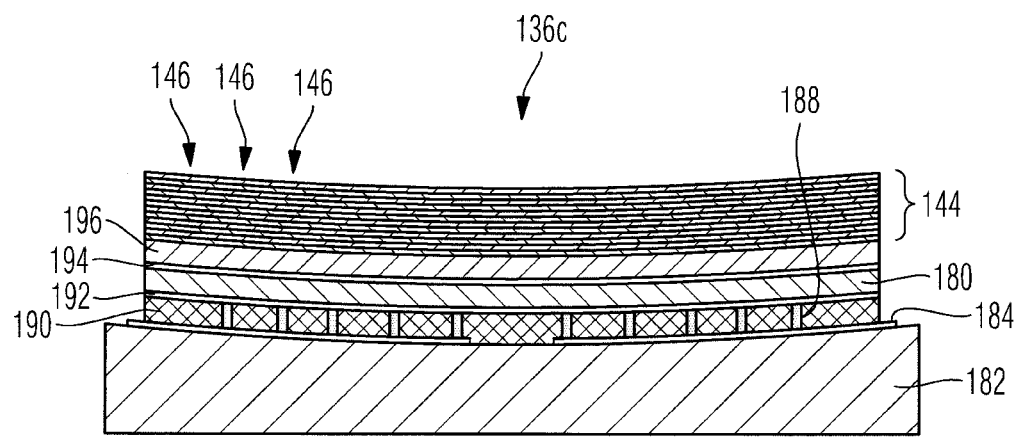
FIG. 7 shows a schematic cross section of a third exemplary embodiment of an optical manipulator of the projection exposure apparatus according to FIG. 1, including a deformable mirror.

FIG. 7 depicts a schematic cross section of a third exemplary embodiment 136*c* of an optical manipulator 136 with a deformable concave mirror 70. Under a reflecting coating 144, the optical manipulator 136*c* contains a piezoelectric layer 180, via which a local deformation of the reflecting coating 144 can be caused by local application of an electric voltage. By way of example, such an optical manipulator 136*c* is described in DE 10 2011 081 603 A1.

Figure 8:
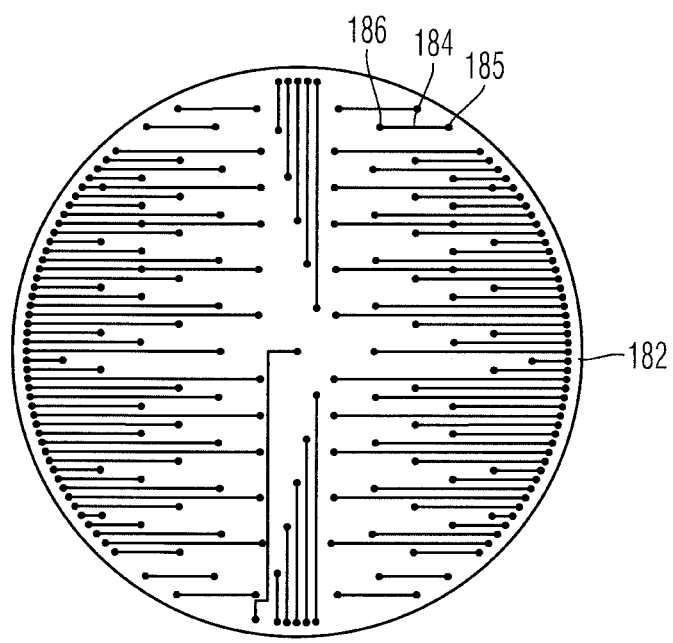
FIG. 8 shows a schematic view of a substrate of the deformable mirror in accordance with FIG. 7, including electric supply lines.

The optical manipulator 136*c* includes a concavely shaped substrate 182, on which a multiplicity of electrical lines 184 are arranged. FIG. 8 shows an exemplary arrangement of the electrical lines 184 on the substrate 182 in a top view. Each electrical line 184 contains a first contact area 185 in the direct vicinity of the circumference of the substrate 182. Furthermore, each electrical line 184 contains a second contact area 186, which is arranged in an insulation layer 190 provided over the electrical lines 184 in the case of a through hole. The insulation layer 190 supports a layer of control electrodes 192 with a two-dimensional embodiment, which are respectively electrically connected to the corresponding electrical line 184 by way of a through hole 188. The piezoelectric layer 180, which in turn supports a counter electrode 194, is arranged on the control electrodes 192. The counter electrode 194 extends over the entire piezoelectric layer 180 and supports a protection layer 196. Finally, the reflecting coating 144 is arranged on the protection layer 196. A local deformation of the piezoelectric layer 180 in the region of the associated control electrode 192 is obtained by applying an appropriate voltage between a first contact area 185 and the counter electrode 194. The local regions of the reflecting coating 144 at each one of the control electrodes 192 therefore represent zones 146 of the optical manipulator 136*c* which are individually adjustable in terms of the optical effect thereof. There is an erroneous synchronization of the control signals of the associated zones 146 in the case of a short circuit between two adjacent control electrodes 192. In this case, it is only possible to set a uniform travel for the affected zones 146.

The thermal manipulator 236 with irradiation of local regions of the lens element 28 by infrared light, depicted in FIG. 1, includes a multiplicity of irradiation units 238, which respectively radiate infrared light provided by an infrared light source 240, in each case with an adjustable intensity, onto a specific region or a zone of the lens element 28. The thermal manipulator 236 can be arranged in a field plane or pupil plane of the projection lens 22, or therebetween, i.e. between field plane and pupil plane. A thermal manipulator 236, which radiates infrared light onto a specific region or a zone of the lens element 28, is particularly suitable for electromagnetic exposure radiation in the deep ultraviolet spectral range (DUV) or in the VUV spectral range.

Figure 9:
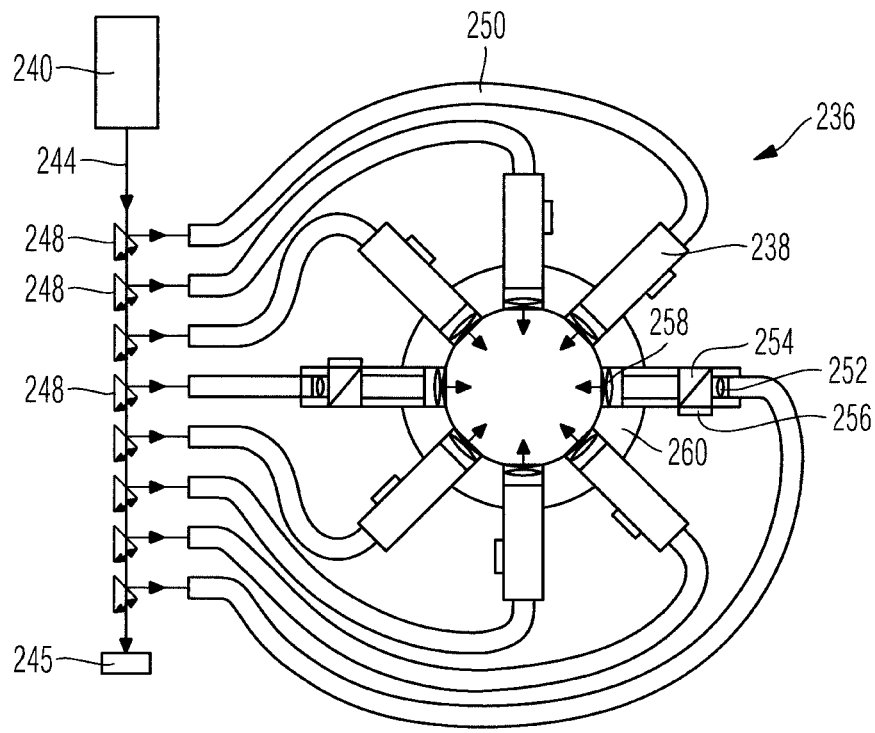
FIG. 9 shows a schematic view of an irradiation device of a thermal manipulator, heated by IR radiation, of the projection exposure apparatus according to FIG. 1.

FIG. 9 schematically depicts an embodiment of such a thermal manipulator 236, as is disclosed, for example, in US 2008/0204682 A1. The infrared light source 240 generates infrared radiation 244 as heating radiation. The IR radiation 244 propagates in the direction of a photoelectronic sensor 245. A multiplicity of pivotable deflection mirrors 248 are arranged in succession in this beam path. A respective one of the pivotable deflection mirrors 248 is situated outside of the beam path of the IR radiation 244 in a first rotational position and it lets the the IR radiation pass in the direction of the photoelectric sensor 245. In a second rotational position, each deflection mirror 248 deflects the IR radiation 244 in such a way that it is coupled into a respective optical waveguide 250. The IR radiation 244 is guided to an irradiation unit 238 through the optical waveguide 250. A deflection mirror 248 and an optical waveguide 250 is provided for each irradiation unit 238.

In an irradiation unit 238, the IR radiation 244 initially passes through a first condenser lens element 252 and subsequently passes through a beam splitter 254 after emerging from the optical waveguide 250. The beam splitter 254 deflects a small portion of the IR radiation 244 onto a photoelectric sensor 256. The much greater portion of the IR radiation 244 emerges from the irradiation unit 238 through a second condenser lens element 258 and irradiates a specific region of the lens element 28. To this end, all irradiation units 238 are held with appropriate alignment by way of a suitably embodied holder 260. The intensity of the irradiation and hence the temperature increase for each region or each zone on the lens element 28 directly depends on the duration and frequency with which the respective deflection mirror 248 couples the IR radiation 244 into the corresponding optical waveguide 250. The intensity of the IR radiation can be detected by the photoelectric sensors 256 for each zone.

Figure 10:
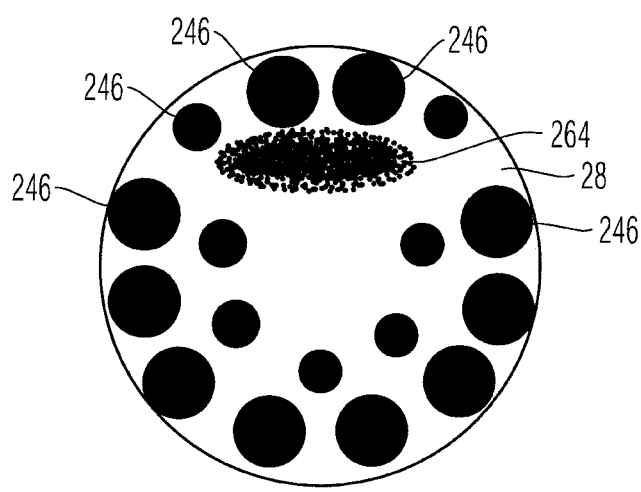
FIG. 10 shows a schematic view of the irradiation of a lens element by the irradiation device according to FIG. 9 for generating a temperature distribution with different temperatures in various local regions of the lens element.

FIG. 10 shows a schematic view of the irradiation of the lens element 28 by the irradiation units 238 in accordance with FIG. 9 for generating a temperature distribution with different temperatures in various local zones 246 of the lens element 28. Large circles symbolize a high intensity of the irradiation and smaller circles symbolize a lower intensity. An exemplary cross section 264 of the exposure beam path 48, which is asymmetric in the depicted case, is likewise depicted. The exposure radiation also leads to a temperature increase—unwanted in this case—in the region of the cross section 264. Temperature-dependent optical properties of the lens element material, such as e.g. the refractive index, change as a result of an increase in temperature. Changes in the optical properties of the lens element 28 induced by the exposure radiation can be compensated for by a suitable irradiation of the lens element 28 by the irradiation units 238.

In accordance with one exemplary embodiment, the optical manipulator 336 depicted in FIG. 1 is embodied as a current-heated or current-operated thermal manipulator and it contains a transparent first optical plate 338 and a transparent second optical plate 340 as optical elements. The optical plates 338, 340 are arranged perpendicular to the optical axis 34 in the beam path of the projection lens 22 and can be heated locally in each case by way of very small electrically conductive and ohmic structures. A gap 342, through which an airflow 344 is guided for cooling purposes, is formed between the optical plates 338, 340.

Figure 11:
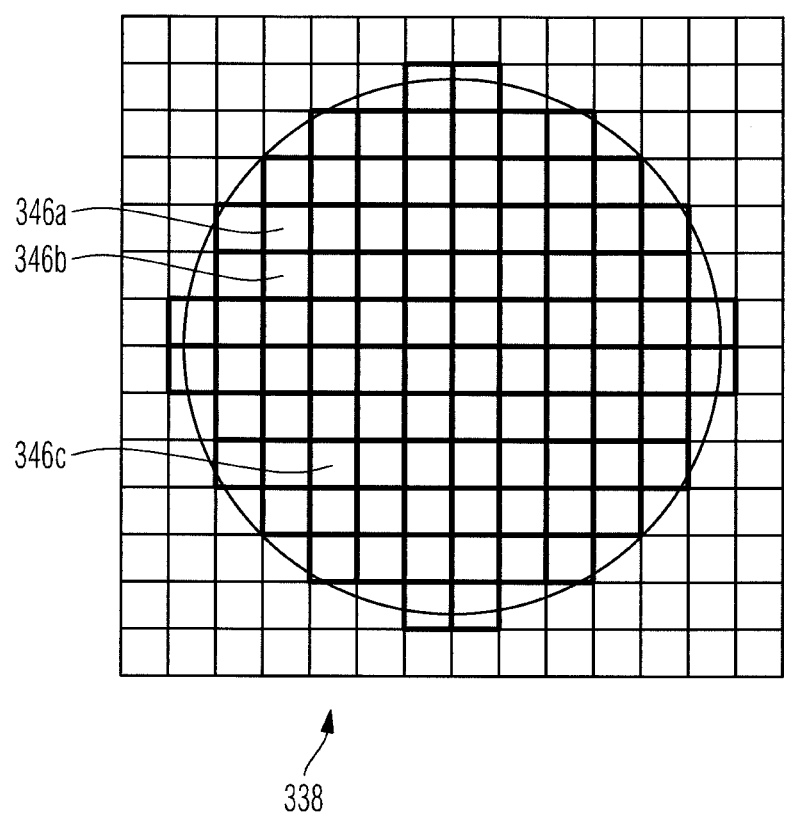
FIG. 11 shows a schematic view of an optical plate of a current-heated optical manipulator for a projection lens of the projection exposure apparatus according to FIG. 1.

FIG. 11 shows a schematic view of the first optical plate 338. The plate 338 contains a two-dimensional matrix of separately heatable zones 346. In this exemplary embodiment, the first optical plate 338 has a 14×14 matrix of zones 346. Here, ninety-six separately heatable zones 346 are arranged in an optically effective manner in the beam path 48 of the projection lens 22. The second optical plate 340 has a corresponding embodiment such that the optical manipulator 336 has a total of one hundred and ninety-two heatable zones 346 in the beam path 48. Alternatively, a different number, arrangement and form of the zones 346 is also possible; by way of example, the zones can be arranged radially or embodied as strips or in a circular arc-shaped manner. In accordance with further exemplary embodiments, the first optical plate 338 has a matrix with at least 5×5 zones, in particular a matrix with at least 10×10 zones, for example a matrix with 10×10 zones or a matrix with 21×21 zones.

The zones 346 are always heated in such a way that colder and warmer regions compensate one another overall in relation to the ambient temperature. Additionally, zones 346 at the edge of the optical plates 338, 340 with thermal contact to other components of the projection lens 22 are actively heated to the ambient temperature. This ensures a thermal neutrality of the optical manipulator 336.

In this exemplary embodiment, the optical plates 338, 340 of the optical manipulator 336 are embodied as plane parallel quartz plates. Alternatively, the optical manipulator may contain, for example, only one optical plate, more than two optical plates, plates that are not plane parallel or one or more lens elements or the like with a multiplicity of heatable zones.

In quartz, a temperature increase at a wavelength of 193 nm leads to an increase in the refractive index. This effect is, inter alia, the cause of wavefront errors as a result of lens heating. In the optical manipulator 336, this effect is used to generate a wavefront deformation which compensates a currently occurring wavefront error in the projection lens 22. As a result of the large number of zones 346, the optical manipulator 336 can be used very flexibly for compensating a multiplicity of different wavefront errors that occur or change during operation.

In the subsequent description, reference is made to both FIG. 1 and FIG. 11. The description of the operation of the manipulator, undertaken below in relation to the optical manipulator 336, can for the most part be transferred analogously to the optical manipulator 136 with a deformable mirror or the optical manipulator 236 with infrared heating. The optical manipulator 336 furthermore contains an actuation device 350 for setting a predetermined temperature profile for both optical plates 338, 340. Such a temperature profile prescribes temperature values or corresponding values, such as a heating power in $W/m^2$, as travel for each zone 346 of both optical plates 338, 340. The temperature profiles therefore represent travel vectors. The actuation device 350 supplies each zone 346 of the optical manipulator 336 with an appropriate heating current for setting the predetermined travel vector and can additionally regulate the cooling by way of the airflow 344.

The projection exposure apparatus 10 furthermore contains a manipulator controller 52 for controlling one or more of the optical manipulators 136, 236 and 336 for compensating wavefront errors occurring or changing during the operation. The manipulator controller 52 includes a determination module 54 for currently present wavefront errors and a travel generator 56 for generating a travel vector suitable for correcting the present wavefront error. In addition to travels for one or more of the optical manipulators 136, 236 and 336 depicted in FIG. 1, the generated travel vector can also contain travels for other manipulators of the projection exposure apparatus 10, for example for positioning devices or deformation devices (not depicted in FIG. 1) of optical elements 28 of the projection lens 22 as well. Below, the generation of a travel vector is described using the example of the optical manipulator 336, with reference being made to the optical plate 338 depicted in FIG. 11. The principle described can be transferred, in analogous fashion to the generation of a travel vector, to the optical manipulator 136, the optical manipulator 236 or a different type of optical manipulator.

In order to determine a currently present wavefront error, the determination module 54 carries out either a measurement or an extrapolation on the basis of previously measured wavefront errors and further parameters, such as e.g. ambient pressure and the like. Such an extrapolation can moreover be carried out on the basis of, for example, previously measured wavefront errors and a model which predicts lens heating. In particular, a wavefront error is measured interferometrically using a wavefront sensor 58, which is integrated into the positioning system 32. A system for interferometric determination of wavefronts is described in e.g. US 2002/0001088 A1. The determination module 54 decomposes a measured wavefront error e.g. numerically into Zernike polynomials up to order n=64. Alternatively, use can also be made of a different order, in particular 36, 49 or 100, or of a decomposition into a different, preferably orthonormal function system. The Zernike coefficients or corresponding other coefficients of a measured or extrapolated wavefront error are subsequently provided for the travel generator 56.

In accordance with one embodiment, the travel generator 56 generates a travel vector with travels for each zone 346 of the optical manipulator 336 and for further manipulators of the projection exposure apparatus 10, such as for each zone 146 of the optical manipulator 136 or for each zone 246 of the optical manipulator 236, on the basis of the Zernike coefficients or other suitable parameters of a measured or extrapolated wavefront error. Here, the travel vector is configured by the travel generator in such a way that the wavefront of the projection lens 22 is approximated to an intended wavefront. In accordance with one embodiment, the intended wavefront can be defined by spherical wavefronts present at the individual field points in the image plane 26, wherein the envelope of these wavefronts along the image plane 26 results in a plane wavefront. Within the scope of this application, such an intended wavefront is referred to as reference wavefront. The approximation of the actual wavefront to the reference wavefront means a minimization of the wavefront error of the projection lens 22.

In accordance with a further embodiment, the intended wavefront, to which the wavefront of the projection lens 22 is approximated using the travel vector, is defined by a wavefront deviating from the reference wavefront in a targeted manner. Such an intended wavefront deviating in a targeted manner can be determined via a so-called imaging enhancement method. Herein, wavefront deviations adapted in a targeted manner to the mask structures to be imaged in the individual case are set, the wavefront deviations rendering it possible to image the corresponding mask structures with a higher resolution.

The travel vector is generated by way of a travel-generating optimization algorithm which, for example, is based on base functions for each zone 346 with a 3×3 matrix, 5×5 matrix or 7×7 matrix for taking into account thermal conduction into adjacent zones 346. The optimization algorithm can be based on algorithms known to a person skilled in the art, e.g. singular value decomposition (SVD) or Tikhonov regularization.

The large number of Zernike coefficients, the large number of travels or degrees of freedom of the manipulator and the boundary conditions to be observed in the process, such as e.g. the thermal neutrality of the optical manipulator 336, lead to a very complicated optimization problem which, in general, can no longer be solved in real time during the exposure operation of the projection exposure apparatus 10. Therefore, previously established travel vectors for specific wavefront errors, for example for specific Zernike coefficients, are stored in a memory 60 of the travel generator 56. These are taken into account when generating a travel by the optimization algorithm for solving the optimization problem. In this way, travel generation by the travel generator 56 is possible in real time during the exposure operation of the projection exposure apparatus 10.

The projection exposure apparatus 10 furthermore contains a zone testing unit 62 for checking the functionality of each zone 346 of the optical manipulator 336. In particular, the zone testing unit 62 tests whether the travels, and hence the temperature, are adjustable within a predetermined intended travel range in each zone 346. A cause of a travel restriction in the heatable zones 346 may lie in an erroneous synchronization of the control signals of two adjacent zones 346*a*, 346*b* in the form of an electrical short circuit between the two adjacent zones 346*a*, 346*b*. As a result of this, both zones 346*a*, 346*b* are always operated with the same heating power. It is only possible to set a uniform travel for the zones 346*a*, 346*b*. A further reason for a travel restriction can be an erroneous resistance characteristic of a zone 346*c*, which may occur during operation or already be present prior to commissioning. The resistance characteristic lying outside of the tolerance can, in particular, lead to a restricted travel range.

If the zone testing unit 62 detects a short circuit between the zones 346*a*, 346*b*, it prescribes a uniform travel as constraint parameter for the short-circuited zones 346*a*, 346*b*. This applies analogously to the short circuit of two adjacent control electrodes 192 described with reference to the embodiment depicted in FIG. 7. If the zone testing unit 62 determines a restricted travel range due to an erroneous resistance characteristic, it prescribes a maximum admissible travel as constraint parameter for the faulty zone 346*b*. In the case of the optical manipulator 136, the zone testing unit 62 can be embodied for a corresponding test of the actuator characteristic of each zone of the deformable mirror 70. Moreover, the zone testing unit 62 can be configured to test the actuator characteristic of each zone of the optical manipulator 236 with an infrared heating.

Travel restrictions due to defective zones 346*a*, 346*b*, 346*c* lead to an erroneous setting of the optical manipulator 336 and therefore to a deficient compensation of a wavefront error that is present in the case of a generated travel vector with a travel that cannot be implemented in the entirety thereof for one or more of these zones 346*a*, 346*b*, 346*c*. New wavefront errors may also be induced. An adaptation of the optimization algorithm that generates the travel to the travel restrictions would be connected with a very large time outlay. The large amount of time outlay for an adaptation of the optimization algorithm to the travel restrictions is due, in particular, to the travel vectors, which are used by the optimization algorithm and predetermined for specific wavefront errors, no longer being valid and being completely re-established by a time-consuming solution of a complex optimization problem.

A checking device 64 of the projection exposure apparatus 10 therefore initially establishes whether a constraint parameter is predetermined for one or more zones 346 and subsequently checks the travels for zones 346*a*, 346*b*, 346*c* with a predetermined constraint parameter with respect to implementability in the case of each generated travel vector. If the checking device 64 determines a non-implementable travel for one or more of the zones with a predetermined constraint, a corresponding correction of the generated travel vector is triggered. Examples of travels that are not implementable in their entirety are, for example, different travels for the short-circuited zones 346*a*, 346*b* or a travel going beyond the restricted travel range for the faulty zone 346*c*. Additionally, the checking device 64 can check all travels for fully functional zones 346 with respect to observing the intended travel range in the case of each generated travel vector. A correction is likewise triggered in the case of a travel generated with faults, which goes beyond the intended travel range. In the case of generating a travel vector for one of the optical manipulators 136 and 236, the checking device 64 can check the travels applicable with respect to the zones 146 and 246, respectively, with respect to observation of the corresponding intended travel range. The zone testing unit 62 and the checking device 64 can also be combined to form a so-called testing system.

The projection exposure apparatus 10 furthermore contains a correction device 66 for correcting the generated travel vector if one or more travels which cannot be implemented in their entirety are present. The correction device 66 initially checks whether a correction value vector for the travel or travels that is/are not implementable is already available in a memory 68. If one is available, it is used for correcting the generated travel vector.

Otherwise, or alternatively, the correction device 66 checks whether a base correction vector for the constraint predetermined by the constraint parameter and for the zone or zones is available in a memory 68. The base correction vector represents a correction value vector for a base fault with respect to the zone or zones and the constraint present. If a base correction vector is available, the correction device 66 establishes a suitable scaling factor on the basis of the generated travel vector, in particular of the travel or travels that is/are not implementable. Subsequently, the correction device 66 calculates the correction value vector by scaling the base correction vector with the established scaling factor. Additionally, the correction device can be embodied for calculating a base correction vector.

Both the correction value vector and the base correction vector contain values for all travels of the generated travel vector. The correction device 66 generates a corrected travel vector by adding the respective correction value of the correction value vector to the corresponding travel of the generated travel vector.

The actuation device 50 subsequently adjusts the heating power for all zones 346 of the optical manipulator 336 in accordance with the travels of the corrected travel vector. In this manner, the optical effect prescribed by the generated travel vector is set in the case of the optical manipulator 336 despite one or more defective zones. There is also an adjustment in accordance with corresponding travels of the corrected travel vector in the other manipulators of the projection exposure apparatus 10, such as e.g. the optical manipulator 136 or the optical manipulator 236.

A further description of the functionality and the interaction of the components of the projection exposure apparatus 10 and, in particular, of the calculation of the base correction vectors and the scaling factors as well is carried out below together with the description of two exemplary embodiments of the method for controlling a projection exposure apparatus.

Figure 12:
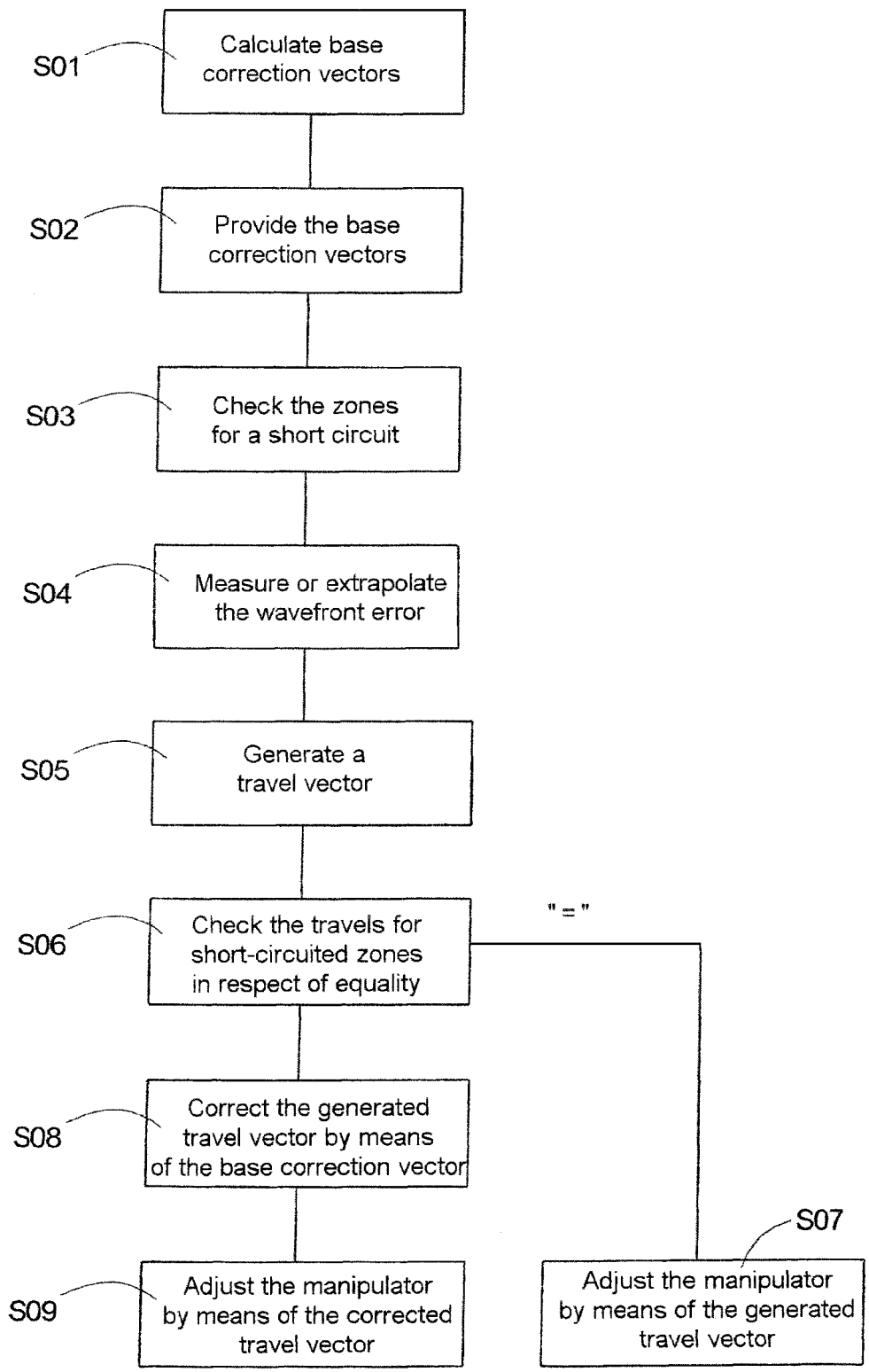
FIG. 12 shows a flowchart for elucidating a first exemplary embodiment of the method according to the disclosure.

FIG. 12 depicts a flowchart for elucidating a first exemplary embodiment of the method for controlling the projection exposure apparatus 10. The method serves to control the projection exposure apparatus 10 when an electric short circuit is present between two adjacent zones 346a, 346b of the current-heated optical manipulator 336. As a result of the short circuit, the two zones 346a, 346b can only be operated with the same heating power or with the same travel.

Therefore, the method can also be applied to other manipulators with a multiplicity of separately adjustable zones and a uniform travel, caused by a fault, of two adjacent zones, for example to the manipulator 136 with an adaptive mirror 70 or to the manipulator 236 with heating by infrared light.

In a first step S01, there is a calculation on a computer of base correction vectors for a multiplicity of possible, or all possible, short circuits between two adjacent zones 346. In the process it is possible, for example, to exclude short circuits between specific zones 346, or to consider these more likely than others, as a result of the structure of the conductor tracks. Initially, a base difference is set between the two involved zones 346 for the purposes of calculating a base correction vector for a short circuit. By way of example, the mean value of the intended travel range is used as travel for the first zone and a maximum possible travel is used for the second zone. By way of example, 0 W/m$^2$ can be set for the first zone and 65 W/m$^2$ can be set for the second zone in the case of an intended travel range for all zones taking into account the cooling of e.g. −65 W/m$^2$ to +65 W/m$^2$. Furthermore, maximum travel ranges are set for all other zones 346 of both optical plates 338, 340, for example +/−20 W/m$^2$ and +/−0.1 K.

Subsequently, travels for all other zones 346 are determined by solving the following optimization problem: observing the set maximum ranges for all other zones 346 of both optical plates 338, 340, setting the predetermined values for the first and the second zone in accordance with the base difference, and minimal aberration by the two optical plates 338, 340. Additionally, the setting options of other manipulators of the projection exposure apparatus 10 can be taken into account. The base correction vector then also contains correction values for the other manipulators. In order to solve the optimization problem, use can be made of, for example, an algorithm based on quadratic programming (QuadProg), sequential quadratic programming (SQP), a Tikhonov regularization and/or an L-curve method according to Hansen.

Alternatively, it is also possible to use different base differences, such as e.g. a difference formed about the mean of the intended travel range, such as e.g. −1 W/m$^2$ for the first zone and +1 W/m$^2$ for the second zone. Likewise, if travels s1 and s2 have already been generated for the first zone and the second zone respectively, it is possible to set the base difference by (s1−s2)/2 for the first zone and (s2−s1)/2 for the second zone. The base correction vector established thus can be used immediately as correction value vector when using the mean value (s1+s2)/2 as travel for the first and the second zone. Therefore, a correction value vector can also be calculated directly with these prescriptions.

Without considering the other manipulators, the travels for the other zones 346 determined thus compensate the optical effect of the predetermined travels for the first and second zone. Conversely, the travels of the other zones in the case of the same travel for the first and second zone induce an optical effect which corresponds to the base difference that cannot be set due to the short circuit. The established base correction vector can be adapted to other differences between the travels of the first zone and the second zone via suitable scaling.

In a second step S02, the established base correction values for the projection exposure apparatus 10 are provided in the memory 68 of the projection exposure apparatus 10. Thus, they can be used immediately after the occurrence of a short circuit for the purposes of correcting the generated travel vector. Alternatively, the base correction values can also be stored in a different memory and provided over a network.

If a short circuit is detected between two zones 346a, 346b when checking S03 the zones 346 via the zone testing unit 62 of the projection exposure apparatus 10, the zone testing unit 62 prescribes a uniform travel as constraint parameter for the short-circuited zones 346a, 346b. Hence, the correction of generated travel vectors is activated. In an alternative exemplary embodiment, the calculation of the base correction vector can be carried out only now, for example by the correction device 66.

In a fourth step S04, a measurement or an extrapolation of the currently present wavefront error is carried out by the determination module 54 during the operation of the projection exposure apparatus 10. The measured or extrapolated wavefront error is subsequently forwarded to the travel generator 56.

Subsequently, there is a generation S05 of a travel vector with travels for each zone 346 of the optical manipulator 336 and for further manipulators of the projection exposure apparatus 10 by way of the travel generator 56. The travels are generated on the basis of the measured or extrapolated current wavefront error of the projection lens 22 in the manner as described above.

In a sixth step S06, the checking device 64 initially establishes whether a constraint parameter is present in relation to a short circuit between two zones 346. If a short circuit is predetermined for two zones 346a, 346b, the travels generated for the short-circuited zones 346a, 346b are subsequently checked with respect to equality by way of the checking device 64.

If the generated travels of the short-circuited zones 346a, 346b are the same or differ by less than a predetermined difference, there is an adjustment S07 of all zones 346 of the optical manipulator 336 and also of other manipulators of the projection exposure apparatus 10 in accordance with the travels of the generated travel vector for compensating the measured or extrapolated wavefront error.

If the generated travels of the short-circuited zones 346a, 346b differ by more than a predetermined difference, there is a correction S08 of the generated travel vector by the correction device 66. To this end, the base correction vector provided in the memory 68 for the short-circuited zones 346a, 346b is initially established. Subsequently, there is a calculation of the scaling factor S via the difference of the generated travels s1 and s2 for the short-circuited zones 346a, 346b and the nominal value N of the base correction vector: $S=(s1-s2)/N$. The nominal value corresponds to the base difference used for calculating the base correction vector.

For the purposes of calculating the scaling factor, a difference weighted with further parameters of the zones 346 can be used instead of the direct difference of the travels s1 and s2 in an alternative embodiment for taking into account these parameters. By way of example, in the case of current-heated zones with the heating power P, the scaling factor S is calculated as travel via a weighted difference $\Delta P$ and the base difference $P_N$ as nominal value by way of $S=\Delta P/P_N$. Here, $\Delta P$ can represent a difference, weighted by the maximum possible heating powers of the zones z1 and z2, for taking into account the resistance characteristic of individual zones:

$$\Delta P=[P_m(z1)\cdot(P_{NP}(z2)+P_{UC}(z2))-P_m(z2)\cdot(P_{NP}(z1)+P_{UC}(z1))]/[P_m(z1)+P_m(z2)]$$

$P_m(z)$: maximum possible heating power of the short-circuited zones z1, z2; $P_{NP}(z)$: predetermined heating power of the zones z1 and z2 for a neutral state of the manipulator; and $P_{UC}(z)$: predetermined heating power for the zones z1 and z2 for compensating a wavefront error.

The correction value vector is determined by scaling the base correction vector with the established scaling factor. Subsequently, a corrected travel vector is calculated by adding the correction values of the correction value vector component-by-component to the travels of the generated travel vector. For the short-circuited zones 346a, 346b, either the mean value (s1+s2)/2 of the generated travels in the case of a base difference of travels about the mean value of the intended travel range or the generated travel for the first zone 346a in the case of a base difference of mean value and maximum value of the intended travel range is set as travel in the corrected travel vector.

Subsequently, all zones 346 of the optical manipulator 336 and also of other manipulators of the projection exposure apparatus 10 are adjusted in step S09 in accordance with the travels of the corrected travel vector for the purposes of compensating the measured or extrapolated wavefront error.

Figure 13:
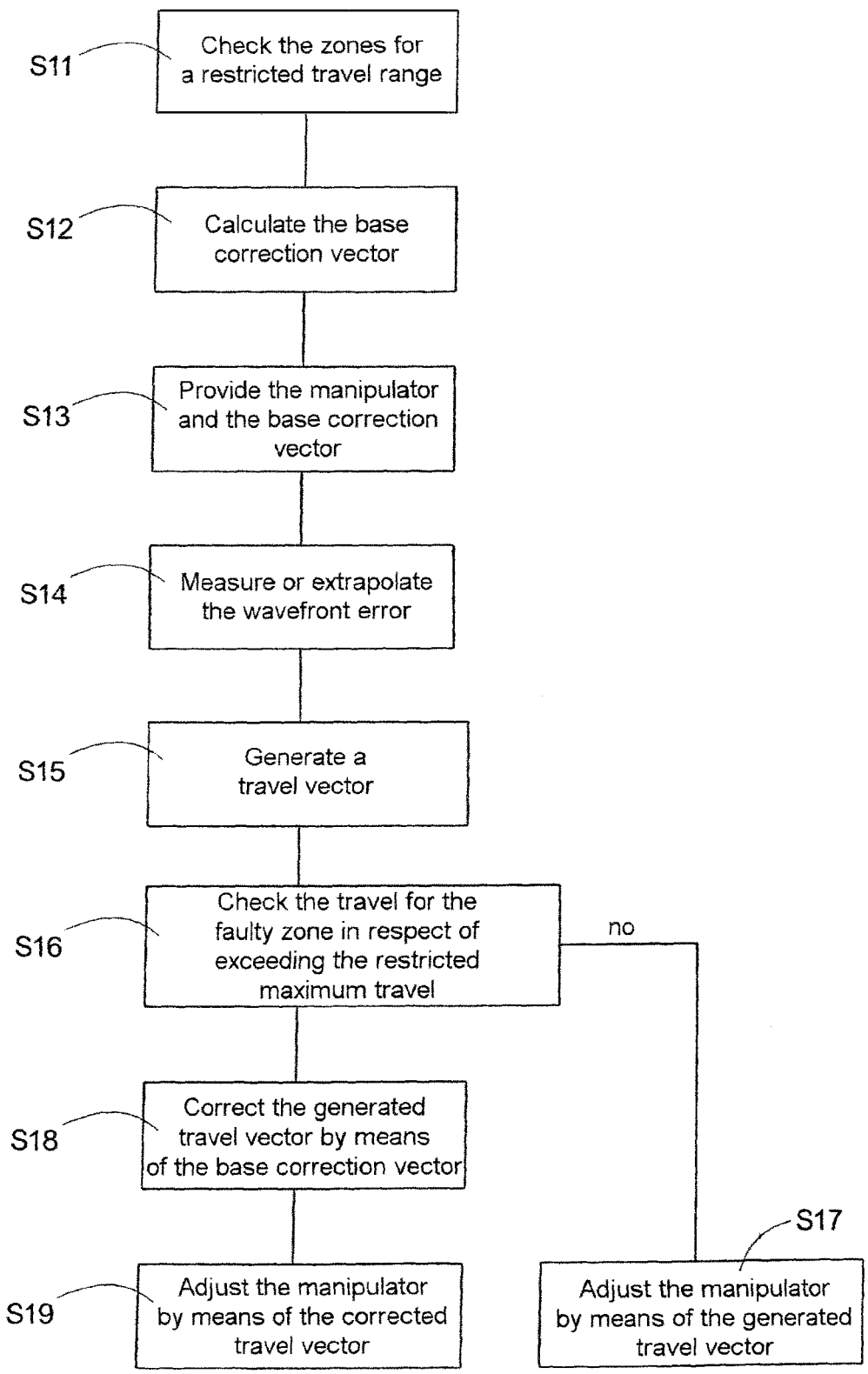
FIG. 13 shows a flowchart for elucidating a second exemplary embodiment of the method according to the disclosure.

FIG. 13 depicts a flowchart for elucidating a second exemplary embodiment of the method for controlling the projection exposure apparatus 10. The method serves to control the projection exposure apparatus 10 if a faulty zone 346c with a resistance characteristic lying outside of the tolerance is present. As a result of this, a restricted travel range of the zone 346c is caused in particular, as a result of which certain generated travels for the zone 346c are not implementable in their entirety. Therefore, the method can also be applied to other manipulators with a multiplicity of separately adjustable zones and a faulty zone with a restricted travel range, for example to the manipulator 136 with an adaptive mirror or to the manipulator 236 with heating by infrared light.

In a first step S11, all zones 346 are already checked during the production of the optical plates 338, 340 or of the optical manipulator 336 with respect to the presence of a restricted travel range due to a resistance characteristic lying outside of the intended range.

If a restricted travel range is determined in a zone 346c, a base correction vector for the faulty zone 346c is calculated in a second step S12. To this end, a maximum correction travel is initially determined. By way of example, the portion of a maximum intended travel that cannot be implemented is set as maximum correction travel. Additionally, maximum travel ranges are set for all other zones 346 of both optical plates 338, 340, for example +/−20 W/m² and +/−0.1 K for each zone.

Subsequently, travels for all other zones 346 are determined by solving the following optimization problem: observing the set maximum ranges for all other zones 346 of both optical plates 338, 340, setting the maximum correction travel for the defective zone 346c, and minimal aberration by the two optical plates 338, 340. Additionally, the setting options of other manipulators of the projection exposure apparatus 10 can be taken into account. The base correction vector then also contains correction values for the other manipulators. In order to solve the optimization problem, use can be made of, for example, an algorithm based on quadratic programming (QuadProg), sequential quadratic programming (SQP), a Tikhonov regularization and/or an L-curve method according to Hansen.

The travels of the base correction vector established thus generate an optical effect of the optical manipulator 336 which corresponds to the non-implementable portion of a maximum travel for the faulty zone. By way of suitable scaling, the base correction vector can be adapted to other travels that cannot be implemented in their entirety for the faulty zone 346c.

In a third step S13, the optical manipulator 336 is provided together with the established base correction vector for the projection exposure apparatus. Here, the base correction vector is stored in the memory 68 of the projection exposure apparatus 10. Additionally, a restricted, maximum possible travel for the zone 346c is set as a constraint parameter. By way of example, this can be carried out via the zone testing unit 62. Therefore, there is an activation of the correction of generated travel vectors.

Subsequently, there is a measurement or an extrapolation S14 of the currently present wavefront error of the projection lens 22 and a generation S15 of a travel vector during the operation of the projection exposure apparatus 10. These steps correspond to steps S04 and S05 of the exemplary embodiment according to FIG. 12.

In a sixth step S16, there initially is a test for the presence of a constraint parameter with a restricted maximum travel for a zone 346 by the checking device 64. If there is a constraint with respect to the maximum travel for a zone 346c, the travel vector generated for the faulty zone 346c is subsequently checked with respect to whether it exceeds the restricted maximum travel for the zone 346c.

If the generated travel of the faulty zone 346c does not exceed the restricted maximum travel, there is an adjustment S17 of all zones 346 of the optical manipulator 336 and also of other manipulators of the projection exposure apparatus 10 in accordance with the travels of the generated travel vector for compensating the measured or extrapolated wavefront error.

If the generated travel of the faulty zone 346c exceeds the restricted maximum travel, there is a correction S18 of the generated travel vector by way of the correction device 66. The base correction vector provided in the memory 68 for the faulty zone 346c is initially established. Subsequently, there is a calculation of a scaling factor S via the difference $\Delta s$ between the generated travel and the restricted maximum travel, and the nominal value N of the base correction vector: $S=\Delta s/N$. The nominal value corresponds to the maximum correction travel used when calculating the base correction vector. Determining the correction value vector is carried out by scaling the base correction vector with the established scaling factor. Subsequently, a corrected travel vector is calculated by adding the correction values of the correction value vector component-by-component to the travels of the generated travel vector. For the faulty zone 346c, the restricted maximum travel is set as travel in the corrected travel vector. Finally, all zones 346 of the optical manipulator 336 and also of other manipulators of the projection exposure apparatus 10 are adjusted in step S19 in accordance with the travels of the corrected travel vector for the purposes of compensating the measured or extrapolated wavefront error.

The base correction vectors calculated according to step S12 can, in a further exemplary embodiment of the method, also be used to compensate clipping as a result of overdriving by way of a generated travel going beyond the maximum intended travel. Here, all travels of the generated travel vector are initially checked with respect to exceeding the maximum intended travel. If an exceedance is present, a base correction vector for the affected zone 346 is established, a scaling factor is determined and a correction value vector is calculated—in a manner analogous to step S18. Now, the maximum intended travel is used instead of the restricted maximum travel when establishing the scaling factor. Subsequently, there is an adjustment of all zones 346 of the optical manipulator 336 and of further manipulators in accordance with step S19.

The present description of exemplary embodiments is to be understood to be exemplary. The disclosure effected thereby firstly enables the person skilled in the art to understand the present disclosure and the advantages associated therewith, and secondly encompasses alterations and modifications of the described structures and methods that are also obvious in the understanding of the person skilled in the art. Therefore, all such alterations and modifications, in so far as they fall within the scope of the disclosure in accordance with the definition in the accompanying claims, and equivalents are intended to be covered by the protection of the claims.

LIST OF REFERENCE SIGNS

10 Projection exposure apparatus
12 Mask
14 Substrate
16 Radiation source
18 Illumination system
20 Optical element of the illumination system
22 Projection lens
24 Object plane
26 Image plane
28 Lens element of the projection lens
30 Positioning system for the mask
32 Positioning system for the substrate
34 Optical axis
48 Beam path
52 Manipulator controller
54 Determination module
56 Travel generator
58 Wavefront sensor
60 Memory of the travel generator
62 Zone testing unit
64 Checking device
66 Correction device
68 Memory
70 Mirror of the projection lens
136 Optical manipulator
136a Optical manipulator
136b Optical manipulator
136c Optical manipulator
138 Manipulation device
140 Actuator
142 Rear side of the mirror
144 Reflecting coating
145 Mirror holder
146 Zone
148 Housing
150 Pressure sensor
152 Drive element
154 Spring
156 Contact element
158 Optical axis of the mirror
160 Support plate
162 Recess
164 Mirror post
166 Position sensor
168 L-shaped lever
170 Connection element
172 Spring
174 Fastening element
176 Projecting part of the mirror 180 Piezoelectric layer
182 Substrate
184 Electrical line
185 First contact area
186 Second contact area
188 Through hole
190 Insulation layer
192 Control electrodes
194 Counter electrode
196 Protection layer
236 Optical manipulator
238 Irradiation unit
240 Infrared light source
244 IR radiation
245 Photoelectric sensor
246 Zone
248 Deflection mirror
250 Optical waveguide
252 First condenser lens element
254 Beam splitter
256 Photoelectric sensor
258 Second condenser lens element
260 Holder
264 Cross section of the exposure beam path
336 Optical manipulator
338 First optical plate
340 Second optical plate
342 Gap
344 Airflow
346 Heatable zone
346a Short-circuited zone
346b Short-circuited zone
346c Faulty zone
350 Actuation device

What is claimed is:

1. A method of controlling a microlithographic projection exposure apparatus which comprises a projection lens and an optical manipulator arranged in a beam path of the projection lens, the optical manipulator having a multiplicity of zones distributed over a cross section of the beam path with an individually adjustable optical effect in the beam path, the method comprising:
on the basis of a determined wavefront error in an image field of the projection exposure apparatus, generating a travel vector suitable to correct the wavefront error, the travel vector comprising a travel for each zone of the optical manipulator via a travel-generating optimization algorithm;
establishing a constraint parameter with respect to the travel for at least one zone of the optical manipulator;
checking travels of the generated travel vector with respect to implementability taking into account the established constraint parameter; and
implementing the following when there is a constraint in the implementability:
obtaining a correction value vector with correction values for a plurality of the zones of the optical manipulator on the basis of the constraint parameter and the generated travel vector;
establishing a corrected travel vector by correcting the travels of the generated travel vector on the basis of the corresponding correction values of the correction value vector; and
adjusting the optical effect of all zones of the optical manipulator with the aid of the corrected travel vector to compensate the wavefront error.

2. The method of claim 1, wherein the constraint parameter prescribes a maximum admissible travel for the at least one zone of the optical manipulator.

3. The method of claim 1, further comprising testing an actuator characteristic of the zones of the optical manipulator with respect to observing a target specification for a travel range and fixing the constraint parameter at a maximum admissible travel for a faulty zone with an actuator characteristic deviating from the target specification.

4. The method of claim 1, wherein:
the optical manipulator comprises a deformable mirror;
the zones are respectively deformable regions of a reflecting coating of the deformable mirror; and
the optical effect for each zone of the deformable mirror is adjusted by a deformation in accordance with the travels of the corrected travel vector.

5. The method of claim 1, wherein:
the optical manipulator comprises an irradiation device and an optical element arranged in the beam path of the projection lens; and
the method comprises using the irradiation device to separately irradiate zones on the optical element with radiation at a wavelength that from an exposure wavelength of the projection exposure apparatus to obtain the optical effect to compensate the wavefront error via heating of the zones.

6. The method of claim 1, wherein:
for each zone, the optical effect of each zones is adjustable via a respective control signal; and
the method further comprises testing for erroneous synchronization of the control signals of two zones; and
the constraint parameter prescribes a uniform travel for the two affected zones if an erroneous synchronization is present.

7. The method of claim 6, wherein:
the optical manipulator comprises a deformable mirror configured so that the optical effect of the zones is individually adjustable via control electrodes contacting a piezoelectric layer; and
the erroneous synchronization of the control signals of two zones is performed by a short circuit of two adjacent control electrodes.

8. The method of claim 6, wherein:
the optical manipulator comprises a current-operated thermal manipulator configured so that the control signals for adjusting the optical effect of the zones are generated by individual electrical heating of the zones;
testing for an erroneous synchronization of the control signals of two zones comprises testing for an electrical short circuit in heating of two adjacent zones;
the electrical short circuit causes both zones to be heated to the same extent; and
the constraint parameter prescribes a uniform travel for the two adjacent zones when a short circuit is present.

9. The method of claim 1, wherein obtaining the correction value vector comprises selecting a correction value vector from a multiplicity of correction value vectors provided for the projection exposure apparatus in a memory.

10. The method of claim 1, wherein obtaining the correction value vector comprises:
establishing a base correction vector with base travels on the basis of the constraint parameter;
establishing a scaling factor on the basis of the generated travel vector and the established base correction vector; and
calculating the correction value vector by scaling the base correction vector with the established scaling factor.

11. The method of claim 10, wherein establishing the base correction vector comprises selecting of a base correction vector from a multiplicity of base correction vectors provided for the projection exposure apparatus in a memory.

12. The method of claim 10, wherein, when a faulty zone of the optical manipulator with a travel range deviating from a target specification is present, establishing the base correction vector comprises:
  determining a maximum correction travel for the faulty zone on the basis of the target specification and an actual travel range;
  determining maximum travel ranges for all other zones of the manipulator; and
  solving an optimization problem with the maximum correction travel of the faulty zone, the maximum travel ranges of all other zones and a minimum or predetermined aberration as constraints for determining the base travels of the base correction vector.

13. The method of claim 12, wherein:
  testing an actuator characteristic of the zones of the optical manipulator to establish a presence of a faulty zone and, when a faulty zone is present, calculating a base correction vector are carried out during the production of the optical manipulator; and
  the optical manipulator is provided for the projection exposure apparatus together with the calculated base correction vector.

14. The method of claim 12, wherein establishing the scaling factor when a faulty zone of the optical manipulator with a travel range deviating from a target specification is present is based on an exceedance value of the travel range by the generated travel and a nominal design of the base correction vector established for the faulty zone.

15. The method of claim 10, wherein:
  the respective optical effect of the zones is adjustable by respective control signals; and
  establishing the base correction vector comprises calculating a base correction vector for two zones of the manipulator, the control signals of which are synchronized, by solving an optimization problem with a predetermined difference between different travels for the two zones, maximum travel ranges for all other zones of the optical manipulator and minimum aberration as constraints to determine the base travels of the base correction vector.

16. The method of claim 15, wherein:
  the optical manipulator comprises a deformable mirror configured so that the optical effect of the zones is individually adjustable via control electrodes contacting a piezoelectric layer, or the optical manipulator comprises a current-operated thermal manipulator configured so that the optical effect of the zones is individually adjustable by electrical heating; and
  calculating the base correction vector is performed for two adjacent, electrically short-circuited zones of the optical manipulator.

17. The method of claim 15, wherein establishing the scaling factor is based on the difference of the generated travels for the two zones and a nominal design of the base correction vector established for the two zones.

18. The method of claim 1, wherein:
  the optical manipulator comprises a plate that is transparent to exposure radiation of the projection exposure apparatus;
  the optical effect of the plate is temperature-dependent;
  each zone is separate, electrically heatable region of the plate; and
  adjusting the optical effect for each zone of the transparent plate is performed by heating in accordance with the travels of the corrected travel vector.

19. The method of claim 18, wherein:
  the optical manipulator comprises a second plate that is transparent to the exposure radiation of the projection exposure apparatus;
  the optical effect of the second plate is temperature-dependent;
  further zones of the manipulator are respectively separate, electrically heatable regions of the second plate; and
  adjusting the optical effect for each zone of the first and second plates is performed by heating in accordance with the travels of the corrected travel vector.

20. The method of claim 1, further comprising determining the wavefront error in the image field of the projection exposure apparatus.

21. A method of controlling a microlithographic projection exposure apparatus which comprises a projection lens and an optical manipulator arranged in a beam path of the projection lens, the optical manipulator having a multiplicity of zones distributed over a cross section of the beam path, the method comprising:
  on the basis of a determined wavefront error in an image field of the projection exposure apparatus, generating a travel vector to correct the wavefront error, the travel vector comprising a travel for each zone of the optical manipulator;
  for at least one of the zones, comparing the corresponding travel of the generated travel vector to a maximum admissible travel; and
  for the at least one zone, when the corresponding travel of the generated travel vector exceeds the maximum admissible travel:
    obtaining a correction value vector with correction values for a plurality of the zones of the optical manipulator on the basis of the generated travel vector and a constraint parameter with respect to the travel for at least one zone of the optical manipulator;
    establishing a corrected travel vector by correcting the travels of the generated travel vector on the basis of the corresponding correction values of the correction value vector; and
    adjusting the optical effect of all zones of the optical manipulator with the aid of the corrected travel vector to compensate the wavefront error.

22. An apparatus, comprising:
  a projection lens configured to image on object from an object plane of the projection lens into an image plane of the projection lens;
  an optical manipulator in a beam path of the projection lens, the optical manipulator having a multiplicity of zones distributed over a cross section of the beam path with an individually adjustable optical effect in the beam path;
  a determination module configured to determine a wavefront error in an image field of the projection exposure apparatus;
  a travel generator configured to generate a travel vector suitable to correct the wavefront error, with travels for each zone of the optical manipulator via a travel-generating optimization algorithm on the basis of the determined wavefront error;
  a test device configured to establish a constraint parameter with respect to the travel for a zone of the optical manipulator and to check the travels of the generated travel vector with respect to implementability taking into account the established constraint parameter;

a correction device configured to correct the generated travel vector in case of a restriction in the implementability of a travel, the correction device configured to obtain a correction value vector with correction values for a plurality of the zones of the optical manipulator on the basis of the constraint parameter and the generated travel vector and to establish a corrected travel vector by correcting the travels of the generated travel vector on the basis of the corresponding correction values of the correction value vector; and an actuation device configured to adjust all zones of the optical manipulator with aid of the corrected travel vector for compensating the wavefront error, wherein the apparatus is a microlithographic projection exposure apparatus.

23. The apparatus of claim 22, wherein the correction device is embodied to establish a base correction vector with base travels on the basis of the constraint parameter, to establish a scaling factor on the basis of the generated travel vector, and to calculate the correction value vector by scaling the base correction vector with the established scaling factor.

* * * * *

UNITED STATES PATENT AND TRADEMARK OFFICE
CERTIFICATE OF CORRECTION

PATENT NO. : 9,760,019 B2
APPLICATION NO. : 15/002564
DATED : September 12, 2017
INVENTOR(S) : Boris Bittner and Holger Walter Page 1 of 1

It is certified that error appears in the above-identified patent and that said Letters Patent is hereby corrected as shown below:

In the Specification

Column 16, Line 59, delete "photoelectronic" and insert -- photoelectric --.

Column 16, Line 64, delete "the the" and insert -- the --.

Signed and Sealed this
Twenty-sixth Day of December, 2017

Joseph Matal
*Performing the Functions and Duties of the*
*Under Secretary of Commerce for Intellectual Property and*
*Director of the United States Patent and Trademark Office*